(12) United States Patent
    Tezuka

(10) Patent No.: US 11,417,694 B2
(45) Date of Patent: Aug. 16, 2022

(54) SEMICONDUCTOR DEVICE AND EQUIPMENT

(71) Applicant: CANON KABUSHIKI KAISHA, Tokyo (JP)

(72) Inventor: Tomoyuki Tezuka, Sagamihara (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 167 days.

(21) Appl. No.: 16/929,424

(22) Filed: Jul. 15, 2020

(65) Prior Publication Data
US 2021/0028203 A1    Jan. 28, 2021

(30) Foreign Application Priority Data

Jul. 26, 2019  (JP) .............................. JP2019-137650

(51) Int. Cl.
    *H01L 27/146* (2006.01)

(52) U.S. Cl.
    CPC .... *H01L 27/1462* (2013.01); *H01L 27/14636* (2013.01); *H01L 27/14641* (2013.01); *H01L 27/14643* (2013.01)

(58) Field of Classification Search
    CPC .......... H01L 27/1462; H01L 27/14636; H01L 27/14641; H01L 27/14643; H01L 27/14621; H01L 27/14627; H01L 27/1461; H01L 27/1464; H01L 27/14634; H04N 5/361
    USPC ...................................................... 257/428
    See application file for complete search history.

(56) References Cited

U.S. PATENT DOCUMENTS

| 9,490,289 | B2 | 11/2016 | Soda |
| 9,812,484 | B2 | 11/2017 | Ishino et al. |
| 9,917,140 | B2 * | 3/2018 | Sato ...................... H01L 51/447 |
| 9,923,023 | B2 | 3/2018 | Ishino et al. |
| 2009/0057766 | A1 * | 3/2009 | Lu ...................... H01L 27/11521 438/587 |
| 2012/0217494 | A1 * | 8/2012 | Okino ................. H01L 27/1464 257/E31.127 |
| 2016/0233262 | A1 * | 8/2016 | Goto ................. H01L 27/14609 |
| 2016/0343750 | A1 | 11/2016 | Ishino et al. |

(Continued)

FOREIGN PATENT DOCUMENTS

| JP | 2009-188068 A | 8/2009 |
| JP | 2010-16242 A | 1/2010 |

(Continued)

*Primary Examiner* — Dao H Nguyen
(74) *Attorney, Agent, or Firm* — Venable LLP

(57) ABSTRACT

Provided is a semiconductor device including a semiconductor layer in which a plurality of pixels each including a photoelectric converter is provided, and an interconnection structure arranged over the semiconductor layer. The plurality of pixels includes a first light-receiving pixel and a second light-receiving pixel, the interconnection structure includes a first insulating film made of a first insulating material, a first insulating member arranged in association with the first light-receiving pixel and made of a second insulating material having a larger hydrogen content than the first insulating material, and a second insulating member arranged in association with the second light-receiving pixel and made of the second insulating material, and a volume of the first insulating member is larger than a volume of the second insulating member.

20 Claims, 13 Drawing Sheets

(56) References Cited

U.S. PATENT DOCUMENTS

| | | | |
|---|---|---|---|
| 2016/0343761 A1 | 11/2016 | Ishino et al. | |
| 2017/0294472 A1* | 10/2017 | Kumano | ............ H01L 27/1464 |

FOREIGN PATENT DOCUMENTS

| | | |
|---|---|---|
| JP | 2011-258884 A | 12/2011 |
| JP | 2012-23319 A | 2/2012 |
| JP | 2014-086551 A | 5/2014 |

* cited by examiner

SEMICONDUCTOR DEVICE AND EQUIPMENT

BACKGROUND OF THE INVENTION

Field of the Invention

The present invention relates to a semiconductor device and equipment.

Description of the Related Art

In recent years, in a semiconductor device such as a solid-state imaging device, there is a demand for reduction of noise caused by influence of a crystal defect in silicon or the interface state between silicon and an insulating film. Under such a background, a technology of using a dangling bond termination effect of hydrogen to reduce noise or dark current occurring near a photoelectric conversion element has been proposed. For example, by arranging a member made of silicon nitride near a photoelectric conversion element, it is possible to supply hydrogen contained in silicon nitride to the photoelectric conversion element and reduce the level of dark current.

On the other hand, Japanese Patent Application Laid-Open No. 2014-086551 discloses a technology of providing a high refractive index region made of silicon nitride in light incidence path to a photoelectric conversion element to reduce color mixture due to leakage of light to an adjacent pixel. Since the high refractive index region disclosed in Japanese Patent Application Laid-Open No. 2014-086551 is arranged near a photoelectric conversion element, hydrogen contained in this high refractive index region may contribute to a reduction of the level of dark current in the photoelectric conversion element.

However, when the high refractive index region disclosed in Japanese Patent Application Laid-Open No. 2014-086551 is arranged, although it is possible to reduce the level of dark current of a photoelectric conversion element as a whole, there is room for consideration of uniformity of dark current for each photoelectric conversion element.

SUMMARY OF THE INVENTION

The present invention intends to provide a semiconductor device that may reduce dark current in a photoelectric converter of a pixel arranged in a light-receiving pixel region and improve non-uniformity of dark current.

According to one aspect of the present invention, provided is a semiconductor device including a semiconductor layer in which a plurality of pixels each including a photoelectric converter is provided, and an interconnection structure arranged over the semiconductor layer, wherein the plurality of pixels includes a first light-receiving pixel and a second light-receiving pixel, the interconnection structure includes a first insulating film made of a first insulating material, a first insulating member arranged in association with the first light-receiving pixel and made of a second insulating material having a larger hydrogen content than the first insulating material, and a second insulating member arranged in association with the second light-receiving pixel and made of the second insulating material, and wherein a volume of the first insulating member is larger than a volume of the second insulating member.

Further, according to another aspect of the present invention, provided is a semiconductor device including a semiconductor layer in which a plurality of pixels each including a photoelectric converter is provided, a substrate arranged so as to overlap the semiconductor layer; and an interconnection structure arranged between the semiconductor layer and the substrate, wherein the plurality of pixels includes a first light-receiving pixel and a second light-receiving pixel, wherein the interconnection structure includes a first insulating film made of a first insulating material and an insulating member made of a second insulating material having a larger hydrogen content than the first insulating material, and wherein a hydrogen content in a portion corresponding to the first light-receiving pixel is larger than a hydrogen content in a portion corresponding to the second light-receiving pixel.

Further, according to yet another aspect of the present invention, provided is a semiconductor device including a semiconductor layer in which a plurality of pixels each including a photoelectric converter are provided, and an interconnection structure arranged over the semiconductor layer, wherein the plurality of pixels include a first light-receiving pixel and a second light-receiving pixel, wherein the interconnection structure includes a first insulating film made of a first insulating material and a second insulating film provided over the semiconductor layer side of the first insulating film and made of a third insulating material that permeates less hydrogen than the first insulating material, wherein an insulating member made of the first insulating material is located between the first insulating film and the semiconductor layer, wherein in a portion corresponding to the first light-receiving pixel, the first insulating film and the insulating member are connected to each other via a first opening provided in the second insulating film, wherein in a portion corresponding to the second light-receiving pixel, the first insulating film and the insulating member are connected to each other via a second opening provided in the second insulating film, and wherein the first opening is larger than the second opening.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

A semiconductor device and a method of manufacturing the same according to a first embodiment of the present invention will be described with reference to FIG. 1 to FIG. 7G.

Figure 1:
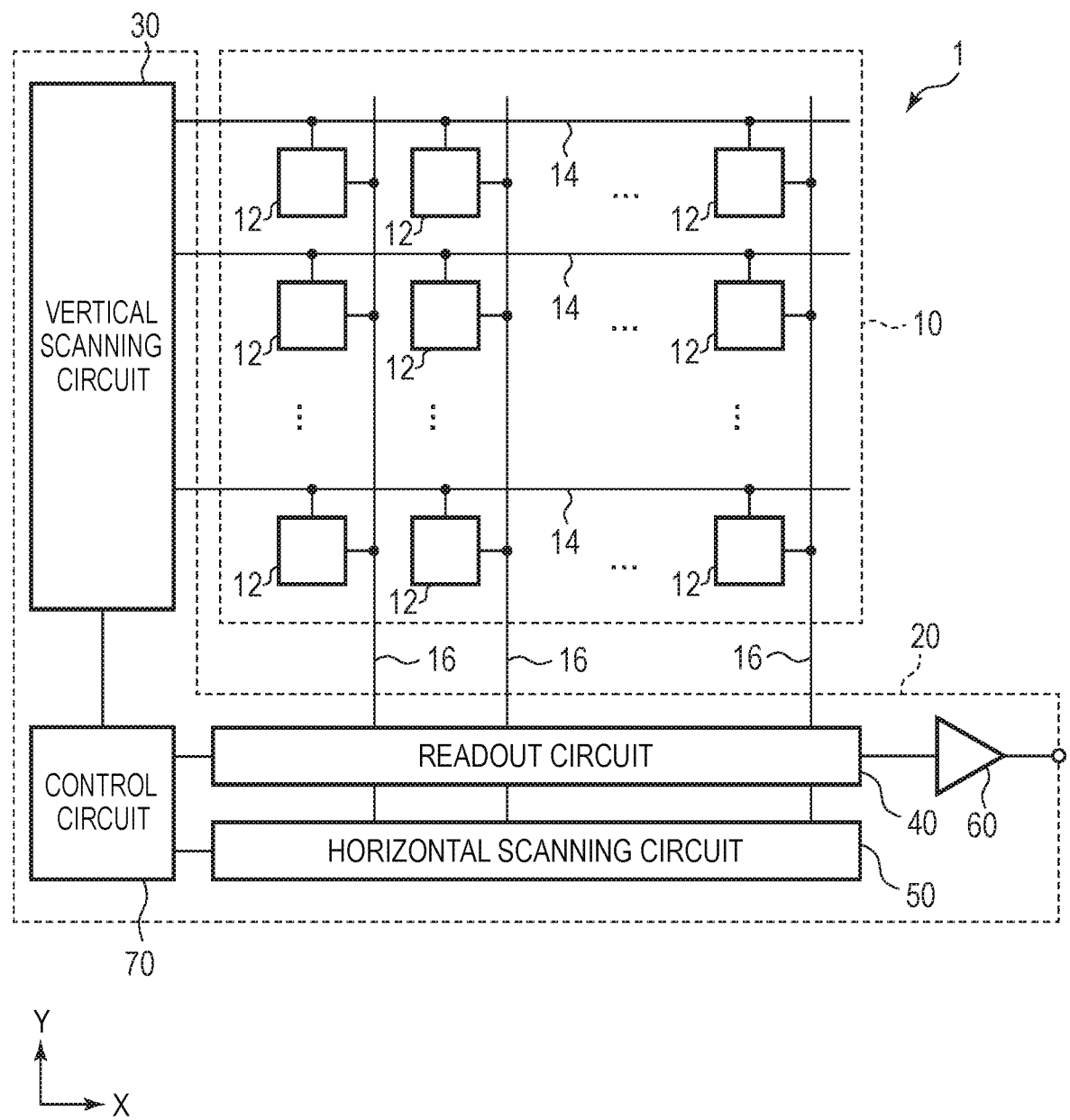
FIG. 1 is a block diagram illustrating a general configuration of a semiconductor device according to a first embodiment of the present invention.
Figure 2:
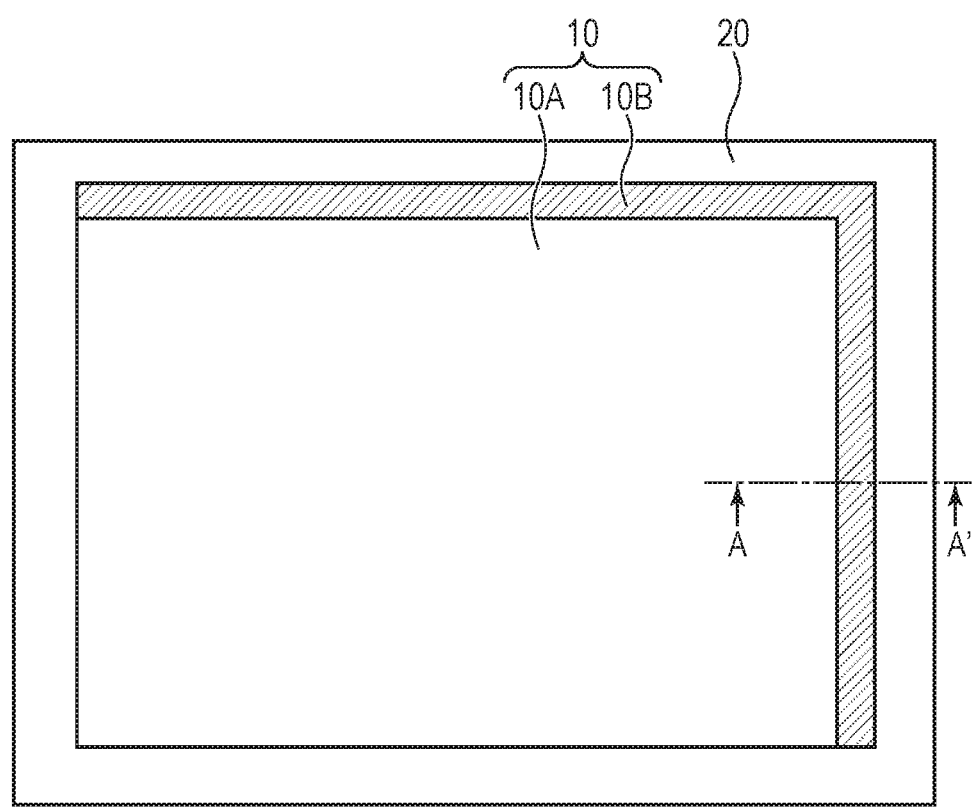
FIG. 2 is a plan view illustrating a configuration example of a pixel region in the semiconductor device according to the first embodiment of the present invention.
Figure 3:
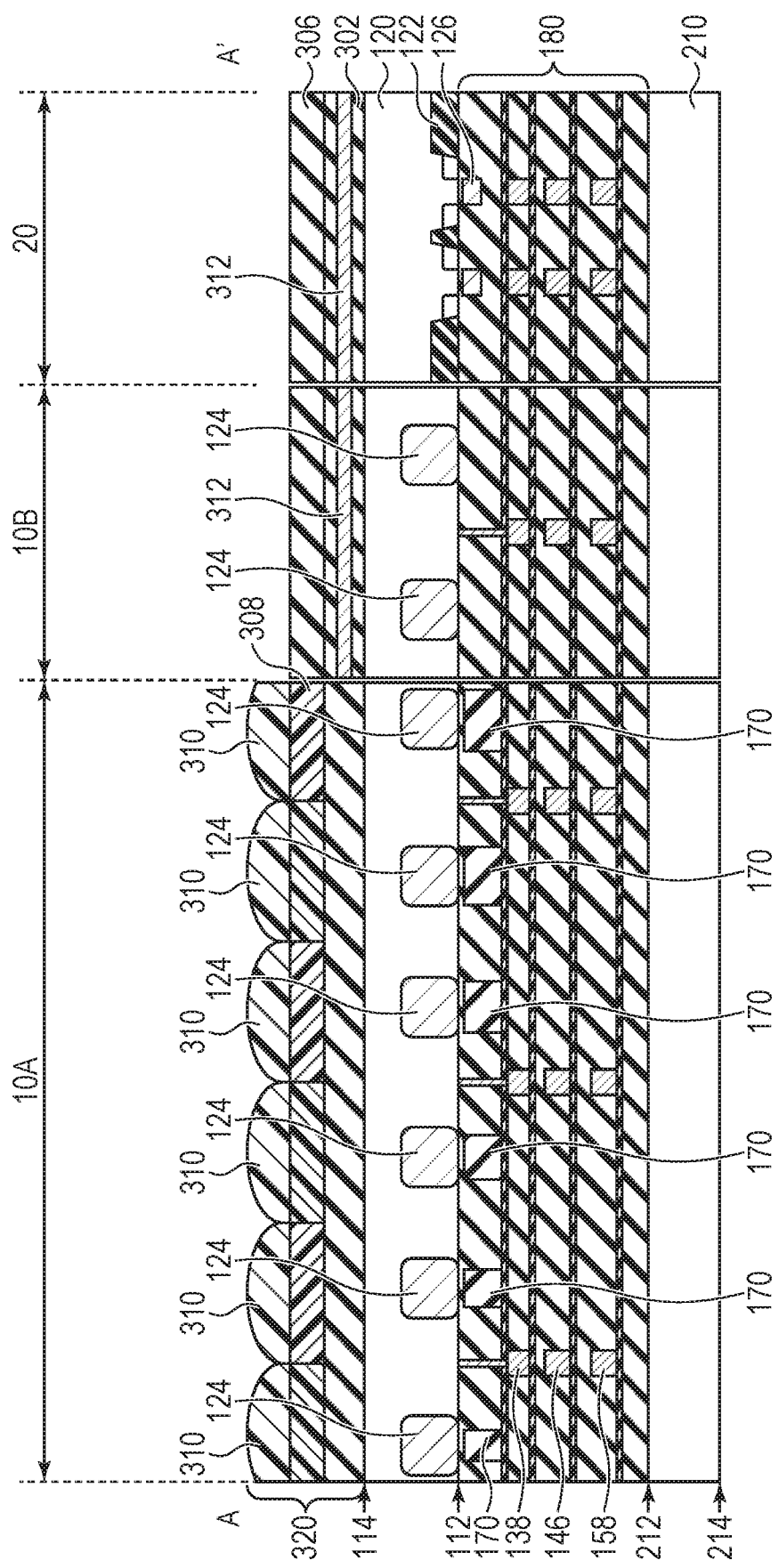
FIG. 3 is a schematic cross-sectional view illustrating the structure of the semiconductor device according to the first embodiment of the present invention.
Figure 4A:
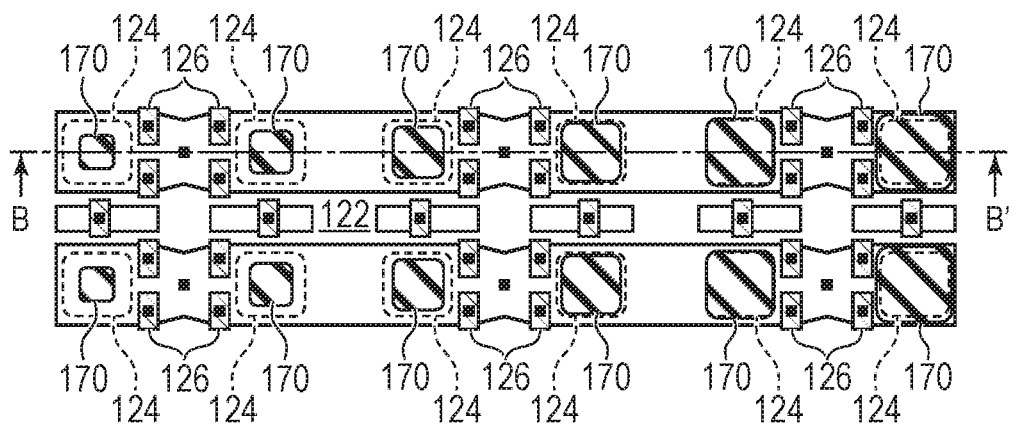
FIG. 4A is a plan view illustrating the structure of a light-receiving pixel region in the semiconductor device according to the first embodiment of the present invention.
Figure 4B:
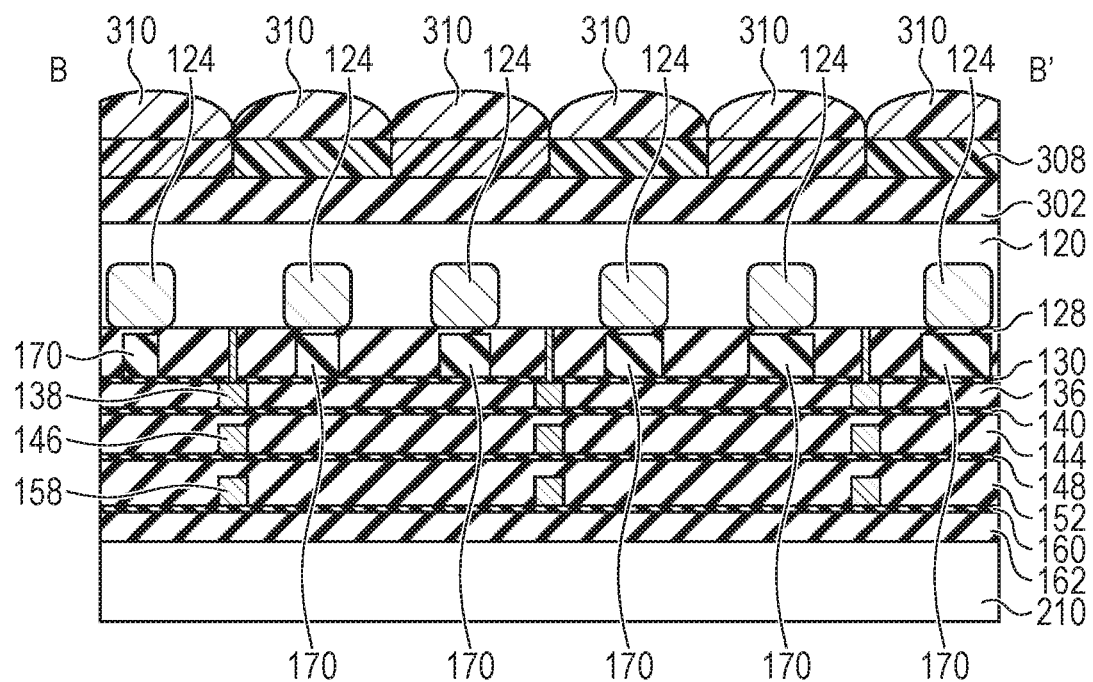
FIG. 4B is a schematic cross-sectional view illustrating the structure of the light-receiving pixel region in the semiconductor device according to the first embodiment of the present invention.

First, the structure of the semiconductor device according to the present embodiment will be described with reference to FIG. 1 to FIG. 4B. FIG. 1 is a block diagram illustrating a general configuration of the semiconductor device according to the present embodiment. FIG. 2 is a plan view illustrating a configuration example of a pixel region in the semiconductor device according to the present embodiment. FIG. 3 is a schematic cross-sectional view illustrating the structure of the semiconductor device according to the present embodiment. FIG. 4A is a plan view illustrating the structure of a light-receiving pixel region in the semiconductor device according to the present embodiment. FIG. 4B is a schematic cross-sectional view illustrating the structure of the light-receiving pixel region in the semiconductor device according to the present embodiment.

As illustrated in FIG. 1, a semiconductor device 1 according to the present embodiment includes a pixel region 10 and a peripheral circuit region 20. The peripheral circuit region 20 includes a vertical scanning circuit 30, a readout circuit 40, a horizontal scanning circuit 50, an output circuit 60, and a control circuit 70.

In the pixel region 10, a plurality of pixels 12 arranged in a matrix to form a plurality of rows and a plurality of columns are provided. Each of the pixels 12 includes a photoelectric converter formed of a photoelectric conversion element such as a photodiode and outputs a pixel signal in accordance with a light amount of incident light. The number of rows and the number of columns of a pixel array arranged in the pixel region 10 are not particularly limited. Further, in the pixel region 10, in addition to light-receiving pixels (effective pixels) that output pixel signals in accordance with a light amount of incident light, light-shielded pixels shielded from light may be arranged. The light-shielded pixel may be, for example, an optical black pixel (OB pixel) in which a photoelectric converter is shielded from light, a NULL pixel having no photoelectric converter, a dummy pixel that outputs no signal, or the like.

On each row of the pixel array of the pixel region 10, a control line 14 is arranged extending in a first direction (X direction in FIG. 1). Each control line 14 is connected to the pixels 12 aligned in the first direction, respectively, to form a signal line common to these pixels 12. The first direction in which the control line 14 extends may be referred to as a row direction or a horizontal direction. The control lines 14 are connected to the vertical scanning circuit 30.

On each column of the pixel array of the pixel region 10, an output line 16 is arranged extending in a second direction (Y direction in FIG. 1) intersecting the first direction. Each output line 16 is connected to the pixels 12 aligned in the second direction, respectively, to form a signal line common to these pixels 12. The second direction in which the output line 16 extends may be referred to as a column direction or a vertical direction. The output lines 16 are connected to the readout circuit 40.

The vertical scanning circuit 30 is a control circuit unit that supplies control signals, which are used for driving readout circuits within the pixels 12 when signals are read out from the pixels 12, to the pixels 12 via the control lines 14 provided on respective rows of the pixel array. The vertical scanning circuit 30 may be formed of a shift register or an address decoder. The vertical scanning circuit 30 drives the pixels 12 of the pixel region 10 on a row basis by using control signals supplied via the control lines 14. The signals read out from the pixels 12 on a row basis are input to the readout circuit 40 via the output lines 16 provided on respective columns of the pixel array.

The readout circuit 40 is a circuit unit that performs predetermined signal processing, for example, signal processing such as an amplification process, an analog-to-digital (A/D) conversion process, or the like on a signal read out from the pixel 12 on each column via the output line 16. The readout circuit 40 may include a signal holding unit, a column amplifier, a correlated double sampling (CDS) circuit, an adder circuit, an A/D converter circuit, a column memory, or the like.

The horizontal scanning circuit 50 is a circuit unit that supplies, to the readout circuit 40, control signals used for transferring signals processed in the readout circuit 40 to the output circuit 60 sequentially on a column basis. The horizontal scanning circuit 50 may be formed of a shift register or an address decoder. The output circuit 60 is a circuit unit that is formed of a buffer amplifier, a differential amplifier, or the like and amplifies and outputs a signal on a column selected by the horizontal scanning circuit 50.

The control circuit 70 is a circuit unit that supplies, to the vertical scanning circuit 30, the readout circuit 40, and the horizontal scanning circuit 50, control signals to control the operation or the timing of these circuits. Note that at least some of the control signals supplied to the vertical scanning circuit 30, the readout circuit 40, and the horizontal scanning circuit 50 may be supplied from the outside of the semiconductor device 1.

As illustrated in FIG. 2, the pixel region 10 includes a light-receiving pixel region 10A in which the pixels 12 used for outputting pixel signals are arranged and a light-shielded pixel region 10B (an optical black region, a light-shielded pixel region) in which the pixels 12 used for outputting reference signals used as a reference for a black level are arranged. The light-receiving pixel region 10A is a region in which light-receiving pixels configured to receive light are arranged. The light-shielded pixel region 10B is a region in which pixels shielded from light, such as optical black pixels (OB pixels) are arranged. While not particularly limited, the light-shielded pixel region 10B is arranged along two sides of the periphery of the pixel region 10, as illustrated in FIG. 2, for example. Further, the peripheral circuit region 20 is arranged around the pixel region 10, as illustrated in FIG. 2, for example.

FIG. 3 is a schematic cross-sectional view taken along a line A-A' of FIG. 2. In FIG. 3, some of the elements located on the line A-A' are extracted from each of the light-receiving pixel region 10A, the light-shielded pixel region 10B, and the peripheral circuit region 20 for illustration. FIG. 4A and FIG. 4B illustrate a schematic cross-sectional view together with a plan view of the outer edge part of the light-receiving pixel region 10A of the above. FIG. 4A is a plan view of the light-receiving pixel region 10A, and FIG. 4B is a cross-sectional view taken along a line B-B' of FIG. 4A. Note that FIG. 4A is a plan view in which each component is vertically projected onto a projection plane parallel to the primary face of a semiconductor layer 120.

The semiconductor device 1 according to the present embodiment includes a semiconductor substrate 210, an interconnection structure 180, a semiconductor layer 120, and an optical structure 320 as illustrated in FIG. 3, FIG. 4A, and FIG. 4B. The semiconductor substrate 210 has a pair of a first face 212 and a second face 214 forming surfaces opposed to each other. The interconnection structure 180, the semiconductor layer 120, and the optical structure 320 are layered in this order over the first face 212 side of the semiconductor substrate 210. The semiconductor substrate 210 is arranged so as to overlap the semiconductor layer 120.

The interconnection structure 180 includes insulating films 162, 160, 152, 148, 144, 140, 136, 130, and 128 layered in this order from the semiconductor substrate 210 side and a plurality of interconnection layers arranged therein. Out of metal members formed of this plurality of interconnection layers, FIG. 3, FIG. 4A, and FIG. 4B illustrate interconnections 158, 146, and 138 arranged in different levels. Note that the number of layers of the interconnection layers arranged in the interconnection structure 180 is not particularly limited.

Out of the insulating films forming the interconnection structure 180, the insulating films 128, 136, 144, 152, and 162 are formed of an insulating material having a relatively low relative dielectric constant, in general, in terms of reduction in the inter-interconnection capacitance. The insulating material having a relatively low relative dielectric constant may be, for example, silicon oxide, silicon oxycarbide, or the like. The insulating material such as silicon oxide or silicon oxycarbide has a property of permeating hydrogen. On the other hand, the insulating films 130, 140, 148, and 160 have a role as an etching stopper film when the interconnections 138, 146, and 158 are formed or a diffusion prevention film for an interconnection material. Under such a role, the insulating films 130, 140, 148, and 160 are formed of silicon carbide, silicon carbonitride, silicon nitride, or the like, for example. The insulating material such as silicon carbide, silicon carbonitride, silicon nitride, or the like has a property of preventing diffusion of hydrogen.

In such a way, the interconnection structure 180 has a multilayer stack in which a plurality of first insulating films formed of insulating materials that permeates hydrogen and a plurality of second insulating films formed of insulating materials that prevent diffusion of hydrogen are layered alternately. The first insulating material forming the first insulating film permeates more hydrogen than the second insulating material forming the second insulating film.

The semiconductor layer 120 has a pair of a first face 112 and a second face 114 forming surfaces opposed to each other. The semiconductor layer 120 is in contact with the interconnection structure 180 on one face side, that is, the first face 112 side. In other words, the interconnection structure 180 is arranged over the semiconductor layer 120.

In the light-receiving pixel region 10A and the light-shielded pixel region 10B, a plurality of pixels, each of which includes a photoelectric converter 124 and a MOS transistor including a gate electrode 126, and element isolation portions 122 are provided on the first face 112 side of the semiconductor layer 120. The plurality of pixels are arranged in an array to form the light-receiving pixel region 10A and the light-shielded pixel region 10B.

In the peripheral circuit region 20, a MOS transistor including the gate electrode 126 and the element isolation portion 122 are provided on the first face 112 side of the semiconductor layer 120.

The optical structure 320 is provided over the other face side, that is, over the second face 114 side of the semiconductor layer 120. The optical structure 320 is arranged on the opposite side of the semiconductor layer 120 from the interconnection structure 180. In the light-receiving pixel region 10A, the optical structure 320 includes an insulating film 302, a color filter layer 308, and micro-lenses 310 provided in this order from the second face 114 side of the semiconductor layer 120. The color filter layer 308 and the micro-lenses 310 are provided to corresponding ones of the plurality of pixels. In the light-shielded pixel region 10B and the peripheral circuit region 20, the optical structure 320 includes the insulating film 302, the light-shielding film 312 arranged inside the insulating film 302, and an insulating film 306 arranged over the insulating film 302.

The semiconductor substrate 210 may be a substrate having only the role as a support substrate. In such a case, an insulating substrate may be used instead of the semiconductor substrate 210. Further, the semiconductor substrate 210 may be a substrate that includes at least some of the circuit elements forming the peripheral circuit region 20, a signal processing circuit used for processing a signal output from the semiconductor device 1, or the like. In such a case, another interconnection structure than the interconnection structure 180 may be further provided between the semiconductor substrate 210 and the interconnection structure 180.

As described above, the semiconductor device 1 according to the present embodiment may be a stacked sensor and also a backside illuminated sensor. The semiconductor device 1 may be referred to as a photoelectric conversion device or an imaging device.

Herein, as illustrated in FIG. 3, FIG. 4A, and FIG. 4B, the semiconductor device according to the present embodiment includes insulating members 170 having a larger hydrogen content than the insulating film 128 inside the insulating film 128 in the light-receiving pixel region 10A. The insulating members 170 are provided to the corresponding pixels 12 arranged in the light-receiving pixel region 10A. Further, the area of the insulating members 170 on a projection plane parallel to the primary face of the semiconductor layer 120 is larger as it is closer to the outer part of the light-receiving pixel region 10A, as illustrated in FIG. 4A. Although only one right side of the four circumference sides forming the outer edge part of the light-receiving pixel region 10A is illustrated in FIG. 3, FIG. 4A, and FIG. 4B, the same applies to the remaining three sides.

Herein, out of the light-receiving pixels arranged in the outer edge part of the light-receiving pixel region 10A, one light-receiving pixel (second light-receiving pixel) and another light-receiving pixel (first light-receiving pixel) arranged in a more outer part of the light-receiving pixel region 10A than the one light-receiving pixel are focused on. In such a case, in the projection plane parallel to the primary face of the semiconductor layer 120, the area of the insulating member 170 arranged in the insulating film 128 in association with the first light-receiving pixel is larger than the area of the insulating member 170 arranged in the insulating film 128 in association with the second light-receiving pixel. In other words, in the interconnection structure 180, the hydrogen content in a portion corresponding to the first light-receiving pixel is larger than the hydrogen content in a portion corresponding to the second light-receiving pixel. Note that the portion corresponding to a light-receiving pixel is a portion overlapping the light-receiving pixel on the projection plane parallel to the primary face of the semiconductor layer 120.

Figure 5:
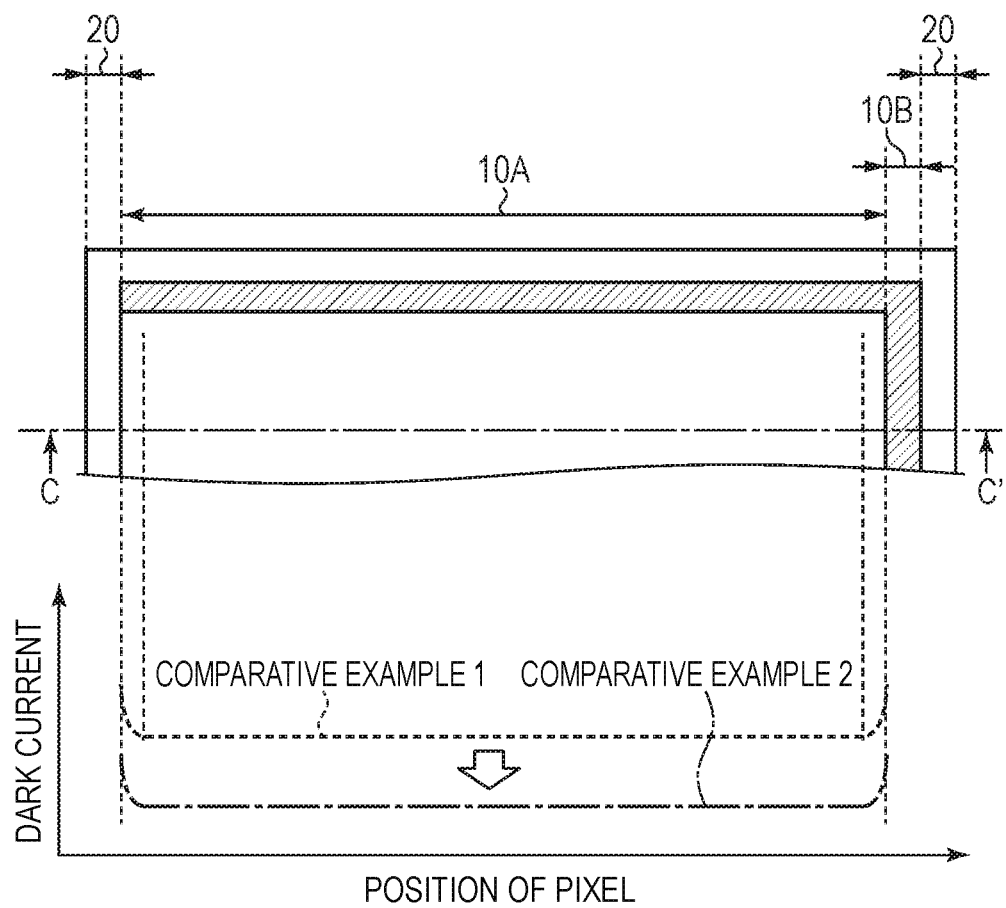
FIG. 5 and FIG. 6 are diagrams illustrating a distribution of dark current in the light-receiving pixel region.
Figure 6:
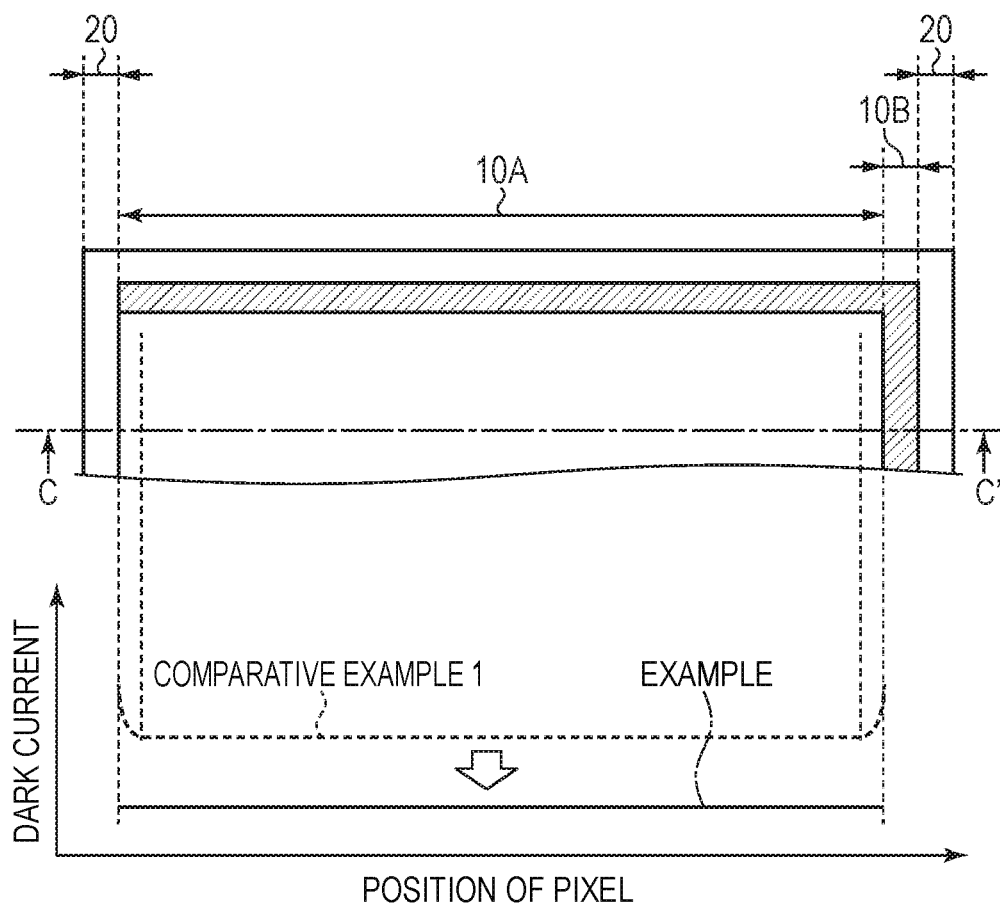

Next, advantageous effects provided by the semiconductor device of the present embodiment will be described with reference to FIG. 5 and FIG. 6. FIG. 5 and FIG. 6 are diagrams illustrating a distribution of dark current of a photoelectric converter inside the light-receiving pixel region 10A. In FIG. 5 and FIG. 6, the horizontal axis represents the position of pixels taken along a line C-C' of the light-receiving pixel region 10A, and the vertical axis illustrates the level of dark current in photoelectric converters of corresponding pixels.

In FIG. 5, the dashed line represents a case of a semiconductor device according to a reference example having no insulating member 170 (Comparative example 1). The dot-dash line represents a case of a semiconductor device in which the insulating members 170 having the same area are arranged evenly over the whole light-receiving pixel region 10A (Comparative example 2).

As illustrated in FIG. 5, dark current is larger near the outer circumference of the light-receiving pixel region 10A in the semiconductor device according to Comparative example 1 having no insulating member 170. The present inventors have reviewed and found that the increase in dark current occurred significantly in a range of a width of several hundred μm from the outer circumference of the light-receiving pixel region 10A. An increase in dark current near the outer circumference of the light-receiving pixel region 10A occurs not only at the boundary part between the light-receiving pixel region 10A and the peripheral circuit region 20 but also at the boundary part between the light-receiving pixel region 10A and the light-shielded pixel region 10B.

Although the cause for an increase in dark current in the edge part of the light-receiving pixel region 10A is not necessarily clear, it is assumed that influence of the light-shielding film 312 arranged in the light-shielded pixel region 10B and the peripheral circuit region 20 is one of the causes. The light-shielding film 312 is formed of a metal material such as tungsten in general and is a prevention film against diffusion of hydrogen. Thus, the amount of hydrogen supply to a light-receiving pixel may decrease compared to the center part of the light-receiving pixel region 10A due to influence of the light-shielding film 312 in the edge part of the light-receiving pixel region 10A. In such a case, the dark current reduction effect due to a dangling bond termination effect may decrease, and dark current may increase in the edge part of the light-receiving pixel region 10A.

Accordingly, in expectation of reduction in dark current due to the dangling bond termination effect of hydrogen, the present inventors attempted to arrange insulating members having a large hydrogen content evenly near the photoelectric converters 124 of respective pixels 12 in the light-receiving pixel region 10A. As a result, the level of dark current was reduced evenly over the whole light-receiving pixel region 10A as illustrated in FIG. 5 as Comparative example 2. Also in this case, however, the phenomenon of larger dark current near the outer circumference of the light-receiving pixel region 10A was not suppressed.

The inventors of the present invention produced semiconductor devices with various configurations by way of trial based on the fact that a change of the configuration around the photoelectric converter causes a change of dark current. A dark current value of the completed photoelectric converter and a hydrogen concentration in the photoelectric converter were then measured, respectively. Among various measurement methods for measuring a hydrogen concentration, the SIMS (secondary ion mass spectrometry) is used. As a result, it was found that there is a negative correlation between the dark current value of the photoelectric converter and the hydrogen concentration in the photoelectric converter. Specifically, the dark current value per unit area of the photoelectric converter is proportional to a logarithmic hydrogen concentration in the photoelectric converter. The slope of the straight line is around −8 [$pA/cm^2/dec$]. For example, when the hydrogen concentration in the photoelectric converter increases by 10 times, the dark current value of the photoelectric converter decreases by 8 [$pA/cm^2$]. In fact, a change in the hydrogen concentration that can be controlled by improvement of the configuration of the semiconductor device is several-fold, and dark current can be controlled within a range less than 8 [$pA/cm^2$].

Further, the inventors have reached the fact that it is effective to change the area of the insulating member 170, which is a hydrogen supply source, as a configuration that provides a change in the hydrogen concentration of the photoelectric converter 124. For example, a case is considered where the dark current value of the photoelectric converter 124 of the pixel 12 in the outer edge part of the light-receiving pixel region 10A is less by 4 [$pA/cm^2$] with respect to the dark current value of the photoelectric converter 124 of the pixel 12 in the center part of the light-receiving pixel region 10A as a reference. In such a case, the area of the insulating member 170 that serves as a hydrogen supply source is preferably set to be about five times that of the center of the outer edge part of the light-receiving pixel region 10A. Although a region in which dark current of the photoelectric converter 124 increases changes in accordance with the specific structure of the semiconductor device and thus is not necessarily defined uniquely, such a region is typically a region within a width of 300 μm or less from the outer circumference of the light-receiving pixel region 10A.

For example, if the width of the outer edge part where dark current of the photoelectric converter 124 increases in the light-receiving pixel region 10A is 200 μm, at most 50 photoelectric converters 124 of 4 μm by 4 μm can be arranged along the width direction of the outer edge part. When these photoelectric converters 124 are numbered with 1st, 2nd, . . . , 50th from the outermost of the light-receiving pixel region 10A, the area of the insulating members 170 is preferably designed so as to be the largest for the 1st photoelectric converter 124 and gradually decrease therefrom in ascending order of number such as 2nd photoelectric converter 124, 3rd photoelectric converter 124, . . . , 50th photoelectric converter 124.

Since dark current in the photoelectric converter 124 differs in accordance with the position of the pixel 12 in the light-receiving pixel region 10A, it is effective to provide the insulating members 170 separated for respective pixels 12 in order to suppress variation in dark current. Further, in terms of increased efficiency of hydrogen supply from the insulating member 170 to the photoelectric converter 124, it is desirable that the photoelectric converter 124 and the insulating member 170 be at least partially overlapped on the projection plane parallel to the primary face of the semiconductor layer 120.

In FIG. 6, the solid line represents a case of the semiconductor device of the present embodiment in which the area of the insulating members 170 is larger as it is closer to the outer part of the light-receiving pixel region 10A (Example). The dashed line represents a case of the semiconductor device of the reference example without the insulating member 170 (Comparative example 1).

In the semiconductor device of the present embodiment, as described above, in the pixels 12 arranged in the outer edge part of the light-receiving pixel region 10A, the area of the insulating members 170 is gradually increased by a suitable rate in accordance with the dark current value of the photoelectric converter 124 as it is closer to the outer part of the light-receiving pixel region 10A. With such a configuration, as indicated by the solid line in FIG. 6, it is possible to reduce dark current in the photoelectric converter 124 and reduce non-uniformity of dark current within the plane of the light-receiving pixel region 10A.

Note that the range in which dark current increases or the amount by which dark current increases in each pixel 12 changes in accordance with the structure of the pixels 12 forming the light-receiving pixel region 10A, the structure of elements arranged in the light-shielded pixel region 10B and the peripheral circuit region 20 that are adjacent to the light-receiving pixel region 10A, manufacturing conditions of the semiconductor device, or the like. It is therefore desirable to know the situation where dark current increases in each pixel 12 and then suitably set the region in which the pixels 12 having the insulating members 170 are arranged or the areas of the insulating members 170 in these pixels 12.

Next, a method of manufacturing the semiconductor device according to the present embodiment will be described with reference to FIG. 7A to FIG. 7G. FIG. 7A to FIG. 7G are cross-sectional views illustrating the method of manufacturing the semiconductor device according to the present embodiment. Note that FIG. 7A to FIG. 7G correspond to cross-sectional views taken along the line B-B' of FIG. 4A.

First, the semiconductor substrate 110 is prepared as a base material of a first component 100. The semiconductor substrate 110 is a silicon substrate, for example, and has a pair of the first face 112 and the second face 114 forming surfaces opposed to each other.

Next, the element isolation portions 122, the photoelectric converters 124, MOS transistors including the gate electrodes 126, and the like are formed on the first face 112 side of the semiconductor substrate 110 by a known manufacturing process of semiconductor devices. Note that the cross-section in which only the photoelectric converters 124 out of these components appear is illustrated in the drawings.

Figure 7A:
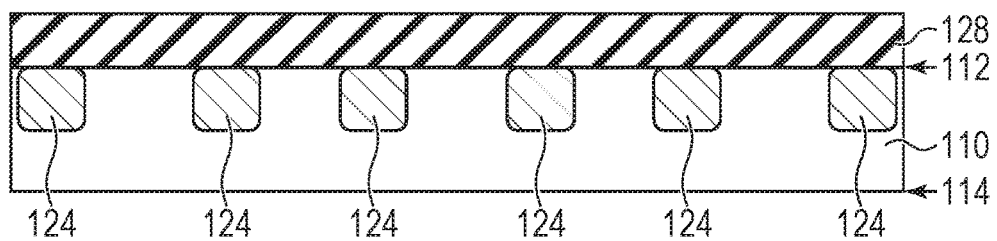
FIG. 7A, FIG. 7B, FIG. 7C, FIG. 7D, FIG. 7E, FIG. 7F, and FIG. 7G are cross-sectional views illustrating a method of manufacturing the semiconductor device according to the first embodiment of the present invention.

Next, the insulating film 128 made of silicon oxide, for example, is formed over the first face 112 side of the semiconductor substrate 110 in which the element isolation portions 122, the photoelectric converters 124, the MOS transistors, and the like are provided (FIG. 7A). For example, after silicon oxide is deposited by a CVD (chemical vapor deposition) method over the first face 112 of the semiconductor substrate 110, the surface of this silicon oxide is planarized to form the insulating film 128 made of a silicon oxide film. The insulating film 128 is formed of an insulating material having a high hydrogen permeability or may be formed of silicon oxycarbide, for example, other than silicon oxide.

Next, a photoresist film 129 having openings in portions corresponding to regions in which the insulating members 170 are to be formed is formed over the insulating film 128 by using photolithography.

Figure 7B:
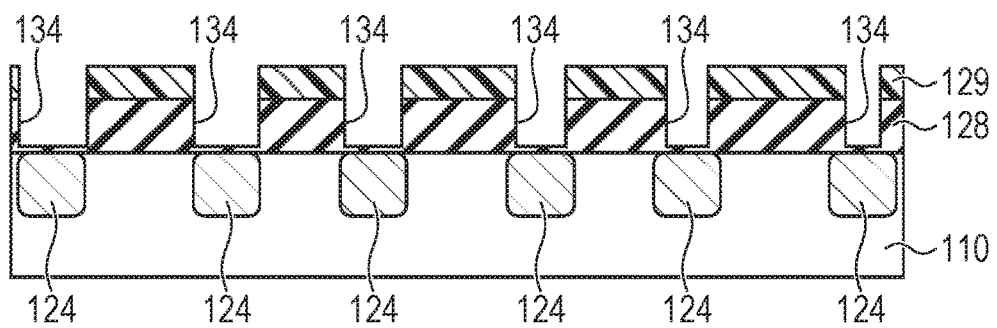

Next, the photoresist film 129 is used as a mask to perform dry etching on the insulating film 128 and form openings 134 in the insulating film 128 (FIG. 7B). In this process, to reduce etching damage on the photoelectric converter 124, the insulating film 128 with a thickness of at least around 10 nm may be left on the bottom of the openings 134. Another insulating film, for example, a silicon nitride film that serves as an etch stopper film may be provided in a layer under the insulating film 128, and this etch stopper film may be used as a stopper to form the openings 134. The positions where the openings 134 are formed correspond to the positions where the insulating members 170 are arranged.

Figure 7C:
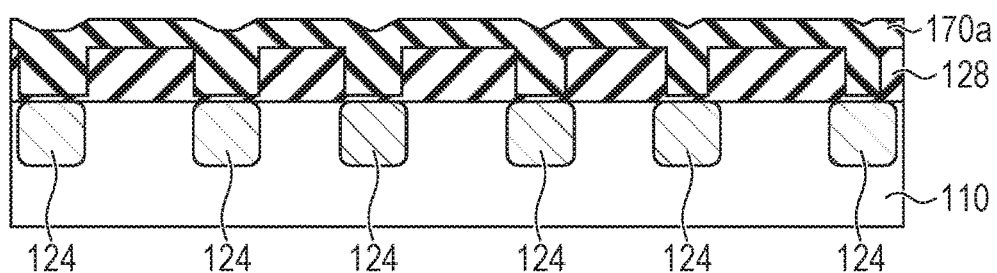

Next, after removing the photoresist film 129, for example, silicon nitride is deposited by the CVD method to form an insulating film 170a made of silicon nitride over the whole surface of the insulating film 128 in which openings 134 are provided (FIG. 7C). It is desirable that no void be present in the opening 134 after deposition of the insulating film 170a. The insulating film 170a is formed of an insulating material having a larger hydrogen content than the insulating member forming the insulating film 128.

Figure 7D:
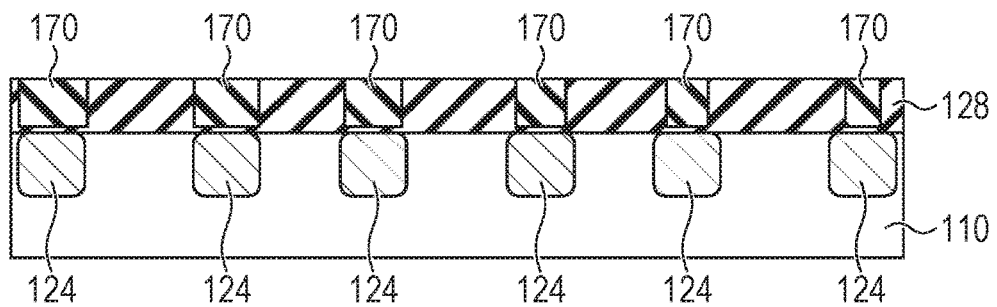

Next, the insulating film 170a over the insulating film 128 is removed by the CMP (chemical mechanical polishing) method, for example, to form the insulating members 170 arranged in the openings 134 (FIG. 7D). The insulating member 170 is provided apart from the first face 112 of the semiconductor substrate 110 by 10 nm or more in accordance with the thickness of the insulating film 128 remaining on the bottom of the opening 134.

Next, silicon carbide is deposited over the insulating film 128 in which the insulating members 170 are provided by the CVD method to form the insulating film 130 made of a silicon carbide film. Note that the insulating film 130 may be formed of a silicon nitride film or a silicon carbonitride film.

Figure 7E:
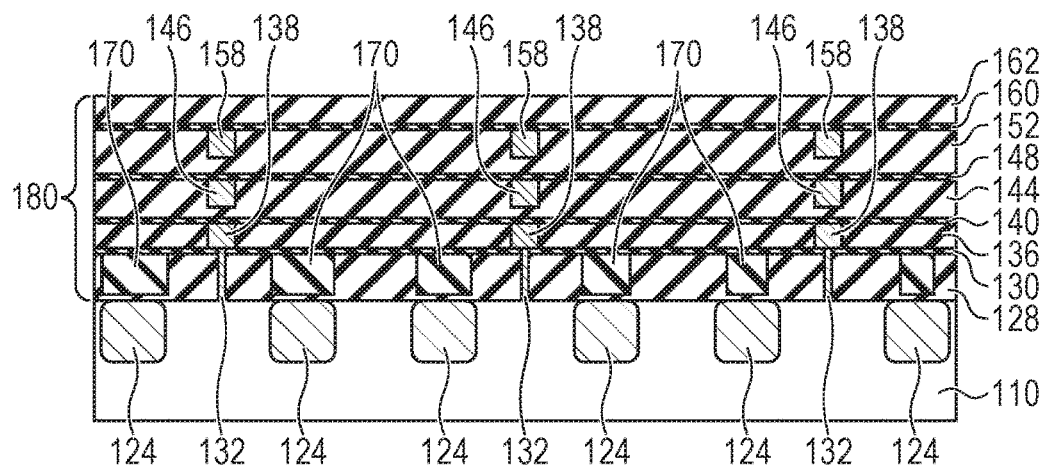

Next, contact plugs 132, the interconnection 138, the insulating films 136, 140, and 144, the interconnection 146, the insulating films 148 and 152, the interconnection 158, the insulating films 160 and 162, and the like are formed to form the interconnection structure 180 by a known manufacturing process of semiconductor devices (FIG. 7E). As described above, the first component 100 including photoelectric conversion elements before joined is completed.

Further, the semiconductor substrate 210 is prepared as a base material of a second component 200 separately from the first component 100. The semiconductor substrate 210 is a silicon substrate, for example, and has a pair of the first face 212 and the second face 214 forming surfaces opposed to each other. Note that the semiconductor substrate 210 may be a substrate having only the role as a support substrate. In such a case, an insulating substrate may be used instead of the semiconductor substrate 210. Further, the semiconductor substrate 210 may be a substrate having at least some of the circuit elements forming the peripheral circuit region 20, a signal processing circuit used for processing a pixel signal, or the like. In such a case, another interconnection structure than the interconnection structure 180 may be further provided between the semiconductor substrate 210 and the interconnection structure 180.

Next, the first component 100 and the second component 200 are opposed and attached to each other so that a face on the insulating film 162 side of the first component 100 and a face on the first face 212 side of the second component 200 face each other.

Figure 7F:
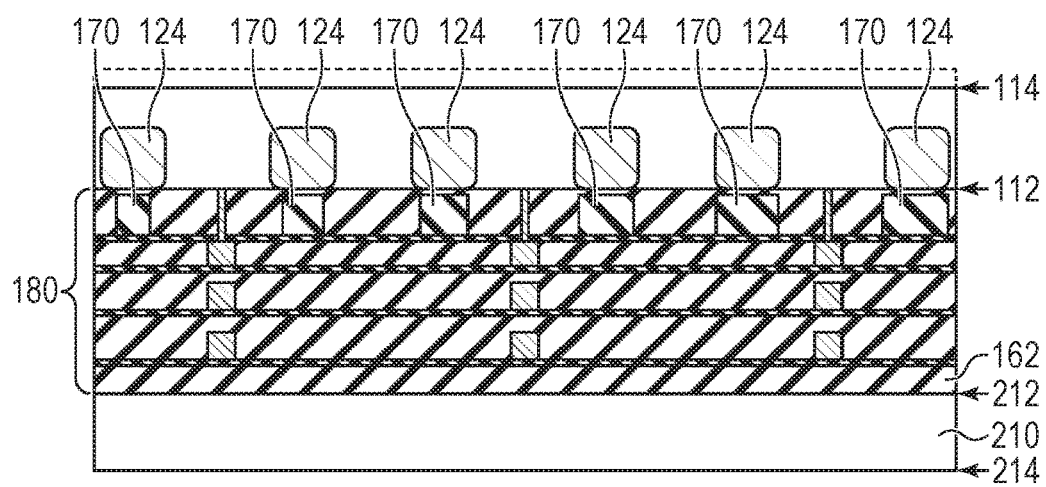

Next, the semiconductor substrate 110 of the first component 100 is thinned to a predetermined thickness from the second face 114 to form the semiconductor layer 120 that is the thinned semiconductor substrate 110 (FIG. 7F). A method of back grind, CMP, etching, or the like may be applied to thinning of the semiconductor substrate 110. Alternatively, another known substrate thinning technique employed in three-dimensional implementation, a through silicon via (TSV) forming process, or the like can be applied. In the following description, a newly exposed surface of the semiconductor layer 120 resulted from thinning of the semiconductor substrate 110 will also be referred to as the second face 114 for the purpose of illustration.

Next, a heat treatment is performed in a nitrogen atmosphere or a hydrogen containing atmosphere (for example, a forming gas atmosphere). This heat treatment causes hydrogen to be emitted from the insulating member 170, this hydrogen reaches the photoelectric converter 124, and thereby the dangling bond on the first face 112 side of the semiconductor layer 120 is terminated with hydrogen. In this process, in the outer edge part of the light-receiving pixel region 10A, the amount of hydrogen supply is larger in the photoelectric converter 124 of the outer pixel 12 having a larger area of the insulating member 170 facing the photoelectric converter 124, and this results in a higher effect of dark current reduction. Accordingly, it is possible to reduce dark current in the photoelectric converter 124 and improve uniformity of dark current within the plane of the light-receiving pixel region 10A.

Note that the timing of performing such a heat treatment is not limited to the time after the semiconductor substrate 110 is thinned, and the heat treatment may be performed by using a heat treatment when the first component 100 and the second component 200 are joined or may be performed at a timing before the first component 100 and the second component 200 are joined. Further, such a heat treatment may be performed before the first component 100 and the second component 200 are joined and further performed at the time when of the first component 100 and the second component 200 are joined or after the semiconductor substrate 110 is thinned. Further, when sufficient hydrogen can be diffused to the photoelectric converter 124 by a thermal history of a backend process such as a course of deposition of the insulating films 152, 160, and 162, it is not necessarily required to perform a separate heat treatment.

Figure 7G:
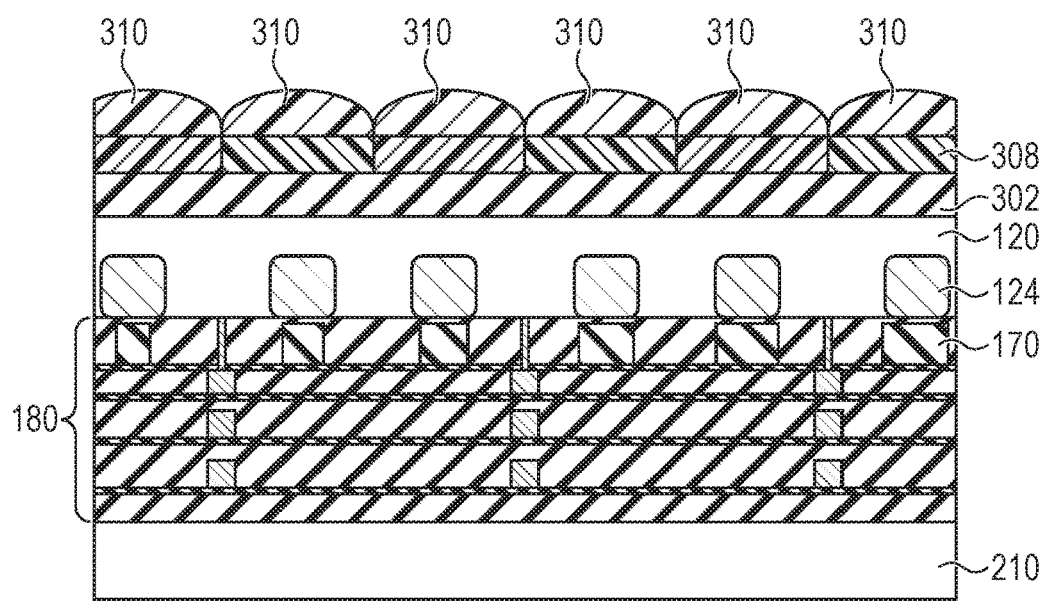

Next, the insulating film 302, the color filter layer 308, the micro-lenses 310, and the like are formed on the second face 114 of the semiconductor layer 120 to complete the semiconductor device according to the present embodiment by using a known manufacturing process of semiconductor devices (FIG. 7G).

As described above, according to the present embodiment, it is possible to reduce dark current in a photoelectric converter of a pixel arranged in a light-receiving pixel region and reduce non-uniformity of dark current.

Second Embodiment

Figure 8A:
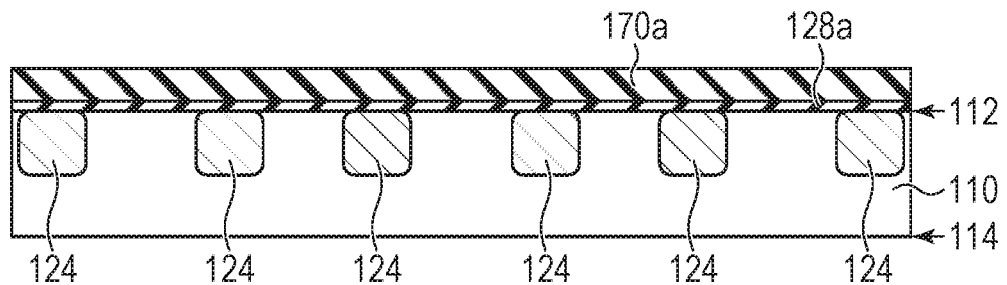
FIG. 8A, FIG. 8B, and FIG. 8C are cross-sectional views illustrating a method of manufacturing a semiconductor device according to a second embodiment of the present invention.
Figure 8B:
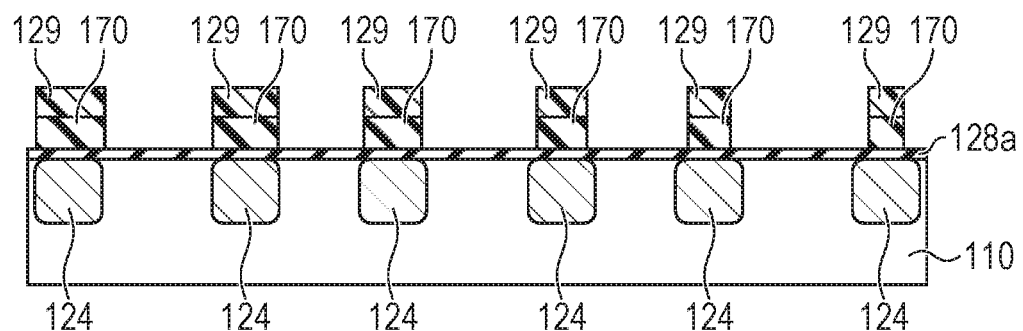
Figure 8C:
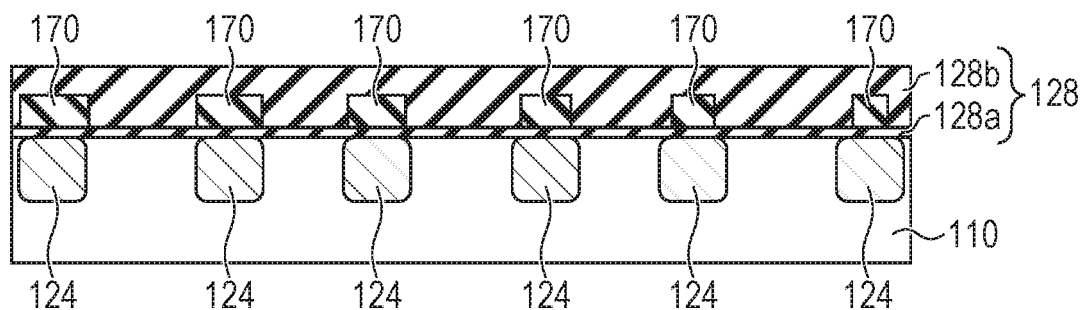

A method of manufacturing a semiconductor device according to a second embodiment of the present invention will be described with reference to FIG. 8A to FIG. 8C. The same components as those of the semiconductor device according to the first embodiment are labeled with the same references, and the description thereof will be omitted or simplified. FIG. 8A to FIG. 8C are cross-sectional views illustrating the method of manufacturing the semiconductor device according to the present embodiment.

First, the semiconductor substrate 110 is prepared as a base material of a first component 100. The semiconductor substrate 110 is a silicon substrate, for example, and has a pair of the first face 112 and the second face 114 forming surfaces opposed to each other.

Next, the element isolation portions 122, the photoelectric converters 124, MOS transistors including the gate electrodes 126, and the like are formed on the first face 112 side of the semiconductor substrate 110 by a known manufacturing process of semiconductor devices. Note that the cross-section in which only the photoelectric converters 124 out of the above components appear is illustrated in the drawings.

Next, an insulating film 128a made of silicon oxide is formed by a CVD method or a thermal oxidation method, for example, on the first face 112 side of the semiconductor substrate 110 in which the element isolation portions 122, the photoelectric converters 124, the MOS transistors, and the like are provided. The insulating film 128a is formed of an insulating material having a high hydrogen permeability or may be formed of silicon oxycarbide, for example, other than silicon oxide.

Next, an insulating film 170a made of silicon nitride, for example, is formed over the insulating film 128a by a CVD method, for example (FIG. 8A). The insulating film 170a is formed of an insulating material having a larger hydrogen content than the insulating member forming the insulating film 128.

Next, the photoresist film 129 having a pattern corresponding to regions in which the insulating members 170 are to be formed is formed over the insulating film 170a by using photolithography.

Next, the photoresist film 129 is used as a mask to perform dry etching on the insulating film 170a and form the insulating members 170 formed of the insulating film 170a (FIG. 8B). In this process, to reduce etching damage on the photoelectric converter 124, the insulating film 128a with a thickness of at least around 10 nm is left in a portion from which the insulating film 170a is removed.

Next, after the photoresist film 129 is removed, an insulating film 128b made of silicon oxide, for example, is formed over the insulating film 128a in which the insulating members 170 are provided. For example, after silicon oxide is deposited by a CVD method, the surface of this silicon oxide is planarized to form the insulating film 128b formed of a silicon oxide film (FIG. 8C). The insulating film 128b is formed of an insulating material having a high hydrogen permeability or may be formed of silicon oxycarbide, for example, other than silicon oxide. Note that the insulating film 128*b* may extend over the insulating members 170 as illustrated or may be the same height as the insulating members 170.

Then, after formed in the same manner as in the first embodiment, the first component 100 is joined to the second component, the optical structure 320 and the like are formed, and thereby the semiconductor device is completed.

Third Embodiment

Figure 9A:
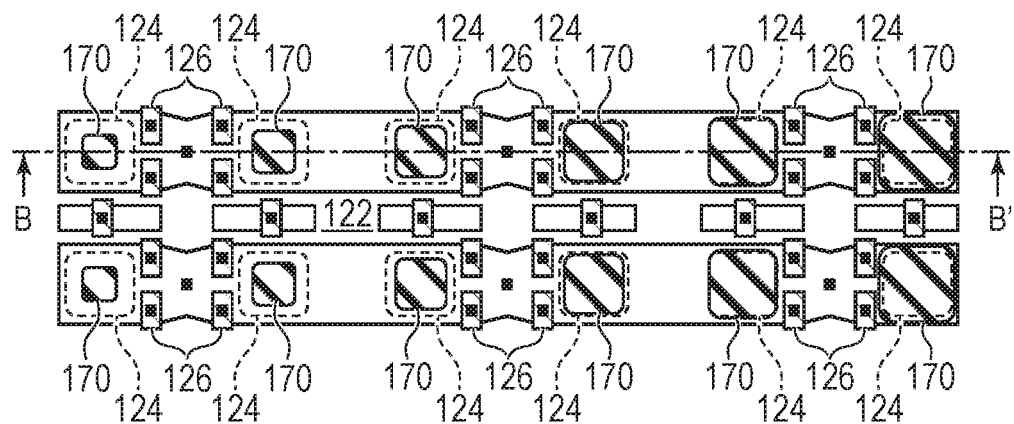
FIG. 9A is a plan view illustrating the structure of a light-receiving pixel region in a semiconductor device according to a third embodiment of the present invention.
Figure 9B:
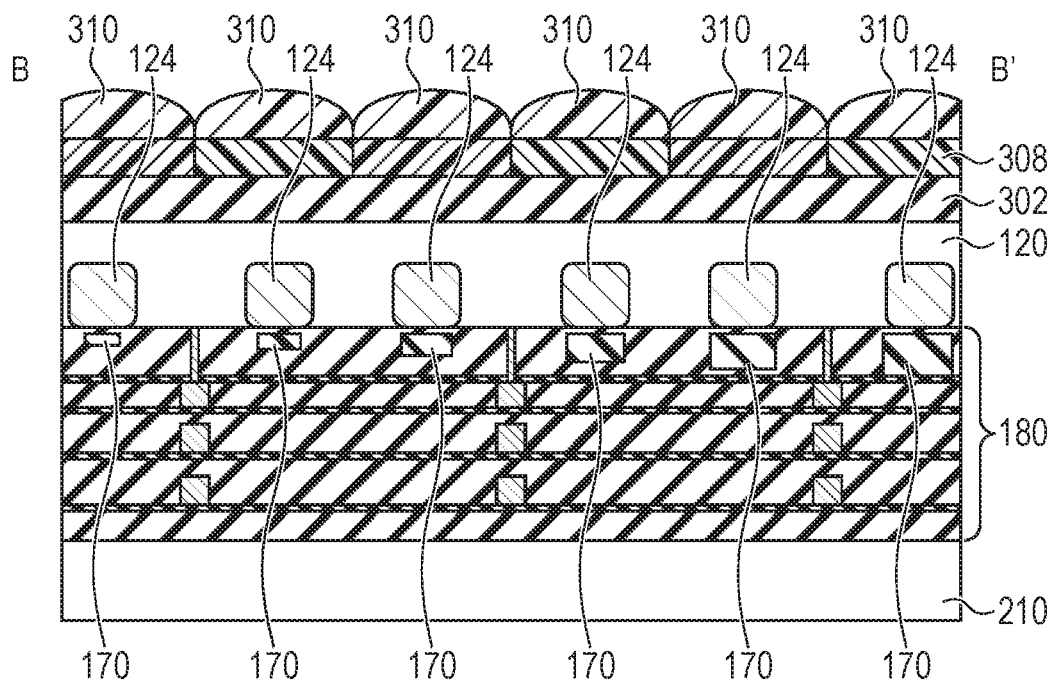
FIG. 9B is a general cross-sectional view illustrating the structure of a light-receiving pixel region in the semiconductor device according to the third embodiment of the present invention.

A semiconductor device and a method of manufacturing the same according to a third embodiment of the present invention will be described with reference to FIG. 9A and FIG. 9B. The same components as those of the semiconductor device according to the first and second embodiments are labeled with the same references, and the description thereof will be omitted or simplified. FIG. 9A is a plan view illustrating a configuration example of the semiconductor device according to the present embodiment. FIG. 9B is a schematic cross-sectional view illustrating a configuration example of the semiconductor device according to the present embodiment.

Although the amount of hydrogen supply is increased by increasing the area of the insulating members 170 as it is closer to the outer part of the light-receiving pixel region 10A in the first embodiment, the amount of hydrogen supply may be increased by increasing the volume of the insulating members 170 as it is closer to the outer part of the light-receiving pixel region 10A. The amount of hydrogen accumulated in the insulating member 170 is larger as the volume of the insulating member 170 is larger. Therefore, in the outer edge part of the light-receiving pixel region 10A, also by increasing the volume of the insulating members 170 as it is closer to the outer part of the light-receiving pixel region 10A, it is possible to reduce dark current in the photoelectric converter 124 and reduce variation of the dark current level within the plane of the light-receiving pixel region 10A.

In FIG. 9A and FIG. 9B, the area of the insulating members 170 and the thickness of the insulating members 170 in a projection plane parallel to the primary face of the semiconductor layer 120 are increased as it is closer to the outer part of the light-receiving pixel region 10A, and thereby the volume of the insulating members 170 is increased as it is closer to the outer part of the light-receiving pixel region 10A. By changing not only the area of the insulating members 170 but also the thickness of the insulating members 170, it is possible to further increase the range of the amount of hydrogen supply from the insulating members 170. Alternatively, with the area of the insulating members 170 on the projection plane parallel to the primary face of the semiconductor layer 120 being constant, the thickness of the insulating members 170 may be increased as it is closer to the outer part of the light-receiving pixel region 10A.

Herein, out of the light-receiving pixels arranged in the outer edge part of the light-receiving pixel region 10A, one light-receiving pixel (second light-receiving pixel) and another light-receiving pixel (first light-receiving pixel) arranged in a more outer part of the light-receiving pixel region 10A than the one light-receiving pixel are focused on. In such a case, in the projection plane parallel to the primary face of the semiconductor layer 120, the volume of the insulating member 170 arranged in the insulating film 128 in association with the first light-receiving pixel is larger than the volume of the insulating member 170 arranged in the insulating film 128 in association with the second light-receiving pixel. In other words, in the interconnection structure 180, the hydrogen content in a portion corresponding to the first light-receiving pixel is larger than the hydrogen content in a portion corresponding to the second light-receiving pixel. Note that the portion corresponding to a light-receiving pixel is a portion overlapping the light-receiving pixel on the projection plane parallel to the primary face of the semiconductor layer 120.

Note that the range in which dark current increases or the amount by which dark current increases in each pixel 12 changes in accordance with the structure of the pixels 12 forming the light-receiving pixel region 10A, the structure of elements arranged in the light-shielded pixel region 10B and the peripheral circuit region 20 that are adjacent to the light-receiving pixel region 10A, manufacturing conditions of the semiconductor device, or the like. It is therefore desirable to know the situation where dark current increases in each pixel 12 and then suitably set the region in which the pixels 12 having the insulating members 170 are arranged or the areas and the thicknesses of the insulating members 170 in these pixels 12.

The method of manufacturing the semiconductor device according to the present embodiment is not particularly limited. For example, the insulating members 170 can be formed by using the process illustrated in FIG. 7A to FIG. 7G for respective regions having different thicknesses of the insulating members 170.

As described above, according to the present embodiment, it is possible to reduce dark current in the photoelectric converters of pixels arranged in the light-receiving pixel region and reduce variation of dark current.

Fourth Embodiment

Figure 10:
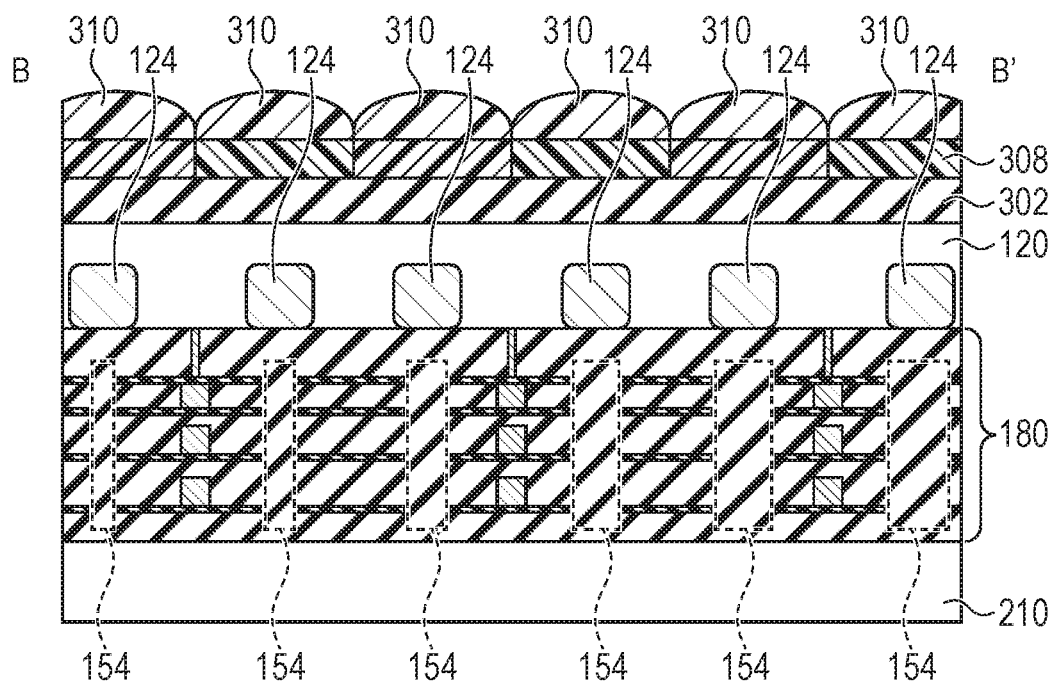
FIG. 10 is a general cross-sectional view illustrating the structure of a light-receiving pixel region in the semiconductor device according to a fourth embodiment of the present invention.

A semiconductor device and a method of manufacturing the same according to a fourth embodiment of the present invention will be described with reference to FIG. 10. The same components as those of the semiconductor device according to the first to third embodiments are labeled with the same references, and the description thereof will be omitted or simplified. FIG. 10 is a schematic cross-sectional view illustrating a configuration example of the semiconductor device according to the present embodiment.

Although hydrogen supplied from the insulating member 170 is used to realize reduction in dark current in the photoelectric converter 124 and improvement of uniformity of dark current within a plane of the light-receiving pixel region 10A in the first to third embodiments, the hydrogen supply source is not limited to the insulating member 170.

For example, out of the insulating films forming the interconnection structure 180, the insulating films 128, 136, 144, 152, and 162 are formed of an insulating material having a relatively low relative dielectric constant, in general, in terms of reduction in the inter-interconnection capacitance. The insulating material having a relatively low relative dielectric constant may be, for example, silicon oxide, silicon oxycarbide, or the like. The insulating material such as silicon oxide or silicon oxycarbide has a property of permeating hydrogen. Therefore, the insulating films 128, 136, 144, 152, and 162 can be used as a hydrogen supply source.

On the other hand, the insulating films 130, 140, 148, and 160 have a role as an etch stopper film or a diffusion prevention film for an interconnection material when the interconnections 138, 146, and 158 are formed. Under such a role, the insulating films 130, 140, 148, and 160 are formed of silicon carbide, silicon carbonitride, silicon nitride, or the like, for example. The insulating material such as silicon carbide, silicon carbonitride, silicon nitride, or the like has a property of preventing diffusion of hydrogen.

Accordingly, in the present embodiment, as illustrated in FIG. 10, openings 154 in the insulating films 130, 140, 148, and 160 are provided, and paths through which hydrogen is diffused are formed between the insulating films 136, 144, 152, and 162 and the photoelectric converters 124. The openings 154 are provided to the corresponding pixels 12 arranged in the light-receiving pixel region 10A. Note that the opening 154 is a site in which an insulating film made of an insulating material having a high hydrogen permeability is embedded, and it can be said that the opening 154 is not a physical hole but is a hole (opening) that permeates hydrogen when viewed from the insulating films 130, 140, 148, and 160 made of an insulating material having a high hydrogen diffusion prevention effect.

Further, in the present embodiment, the area of the openings 154 on a projection plane parallel to the primary face of the semiconductor layer 120 is increased for a more outer pixel 12 in the light-receiving pixel region 10A. With such a configuration, it is possible to increase the amount of hydrogen supply to the photoelectric converter 124 for a more outer pixel 12 in the outer edge part of the light-receiving pixel region 10A. Accordingly, in the same manner as in the first to third embodiments, it is possible to reduce dark current in the photoelectric converter 124 and reduce non-uniformity of dark current within a plane of the light-receiving pixel region 10A.

Note that, although each opening 154 is provided in the insulating films 130, 140, 148, and 160 in the example of FIG. 10, each opening 154 can be provided in an insulating film in one or more layers on the semiconductor layer 120 side out of the insulating films 130, 140, 148, and 160.

Further, the insulating film in which the openings 154 are formed may be different in accordance with the position of the pixel 12. For example, it is also possible to provide the opening 154 in the insulating films 130, 140, 148, and 160 in the outer pixel 12 in the outer edge part of the light-receiving pixel region 10A and provide the opening 154 only in the insulating film 130 in the inner pixel 12 in the outer edge part of the light-receiving pixel region 10A. In such a case, the area of the opening 154 in the projection plane parallel to the primary face of the semiconductor layer 120 is not necessarily required to be larger for a more outer pixel 12 in the light-receiving pixel region 10A.

Further, in addition that the openings 154 are provided in the insulating films 130, 140, 148, and 160, the insulating members 170 illustrated in the first to third embodiments may be further arranged. In such a case, each insulating member 170 is not necessarily required to be provided in the insulating film 128 and may be arranged in the insulating film 136 or 144, for example, as long as each insulating member 170 is arranged in a location where a path through which hydrogen can be supplied to the photoelectric converter 124 via the opening 154 can be secured.

As described above, according to the present embodiment, it is possible to reduce dark current in the photoelectric converters of pixels arranged in the light-receiving pixel region and reduce variation of dark current.

Fifth Embodiment

Figure 11:
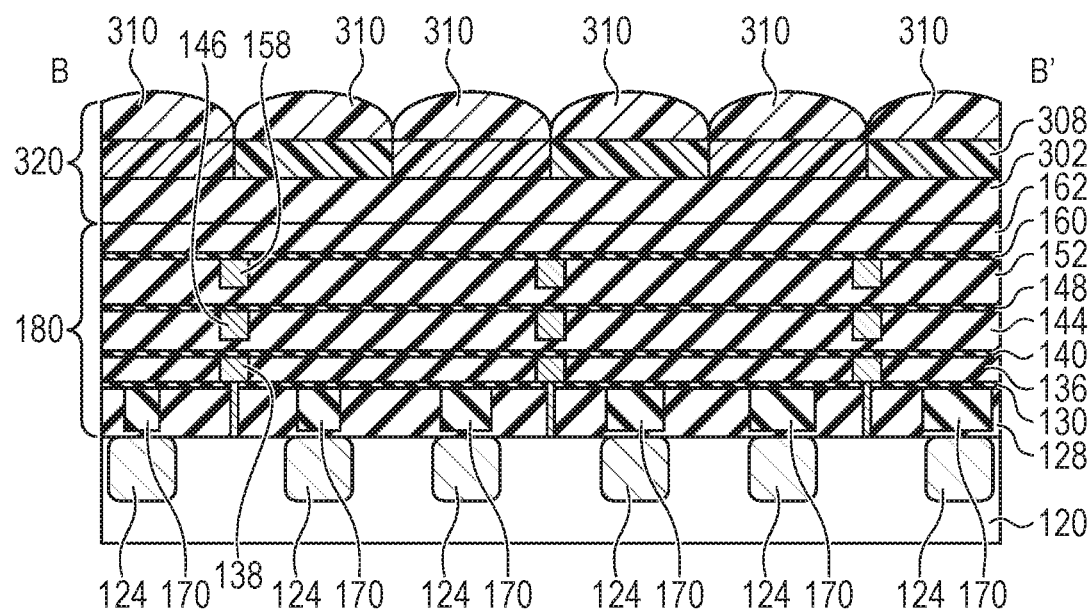
FIG. 11 is a general cross-sectional view illustrating the structure of a light-receiving pixel region in the semiconductor device according to a fifth embodiment of the present invention.

A semiconductor device according to a fifth embodiment of the present invention will be described with reference to FIG. 11. The same components as those of the semiconductor device according to the first to fourth embodiments are labeled with the same references, and the description thereof will be omitted or simplified. FIG. 11 is a schematic cross-sectional view illustrating a configuration example of the semiconductor device according to the present embodiment.

Although the example in which the present invention is applied to a sensor of the backside illuminated type has been described in the first to fourth embodiments, the present invention can be applied to a sensor of a front side illuminated type. In the present embodiment, a configuration example when the present invention is applied to a sensor of the front side illuminated type will be described.

As illustrated in FIG. 11, the semiconductor device 1 according to the present embodiment includes the semiconductor layer 120, the interconnection structure 180, and the optical structure 320.

The semiconductor layer 120 has a pair of the first face 112 and the second face 114 forming surfaces opposed to each other. The interconnection structure 180 and the optical structure 320 are layered in this order on the first face 112 side of the semiconductor layer 120. Note that the semiconductor layer 120 may be a semiconductor substrate.

The interconnection structure 180 includes insulating films 128, 130, 136, 140, 144, 148, 152, 160, and 162 layered in this order from the semiconductor layer 120 side and a plurality of interconnection layers arranged therein. Out of metal members formed of these plurality of interconnection layers, FIG. 11 illustrates the interconnections 138, 146, and 158 arranged in different layers. The interconnection structure 180 has a multilayer stack in which a plurality of first insulating films formed of insulating materials that permeates hydrogen and a plurality of second insulating films formed of insulating materials that prevent diffusion of hydrogen are layered alternately in the same manner as in the first to fourth embodiments. The first insulating material forming the first insulating film permeates more hydrogen than the second insulating material forming the second insulating film.

The insulating members 170 having a larger hydrogen content than the insulating film 128 are provided in the insulating film 128 of the light-receiving pixel region 10A in the same manner as in the first to third embodiments. The insulating members 170 are provided to the corresponding pixels 12 arranged in the light-receiving pixel region 10A. Further, the area of the insulating members 170 on a projection plane parallel to the primary face of the semiconductor layer 120 is larger as it is closer to the outer part of the light-receiving pixel region 10A, as illustrated in FIG. 11.

The optical structure 320 is provided on the interconnection structure 180. The optical structure 320 includes the insulating film 302, the color filter layer 308, and the micro-lenses 310 provided in this order from the second face 114 side of the semiconductor layer 120. The color filter layer 308 and the micro-lenses 310 are provided to corresponding ones of the plurality of pixels.

Also in the semiconductor device according to the present embodiment, in the outer edge part of the light-receiving pixel region 10A, the area of the insulating members 170 on the projection plane parallel to the primary face of the semiconductor layer 120 is larger for a more outer pixel 12 in the light-receiving pixel region 10A. With such a configuration, it is possible to increase the amount of hydrogen supply to the photoelectric converter 124 for a more outer pixel 12 in the outer edge part of the light-receiving pixel region 10A. Accordingly, in the same manner as the first to third embodiments, it is possible to reduce dark current in the photoelectric converter 124 and reduce non-uniformity of dark current within a plane of the light-receiving pixel region 10A.

Note that, in the case of a sensor of the front side illuminated type, incident light enters the photoelectric converter 124 of each pixel 12 via the interconnection structure 180. Thus, incident light may enter the photoelectric converter 124 via the insulating member 170 at some positions where the insulating member 170 is arranged, which may change characteristics of the light entering the photoelectric converter 124 for each pixel 12. In such a case, the insulating member 170 may be arranged in a region within the pixel 12 that does not overlap the photoelectric converter 124 on the projection plane parallel to the primary face of the semiconductor layer 120. Although the hydrogen supply from the insulating member 170 to the photoelectric converter 124 is the most efficient when the photoelectric converter 124 and the insulating member 170 are overlapped with each other on the projection plane parallel to the primary face of the semiconductor layer 120, the photoelectric converter 124 and the insulating member 170 are not necessarily required to be overlapped with each other.

As described above, according to the present embodiment, it is possible to reduce dark current in a photoelectric converter of a pixel arranged in a light-receiving pixel region and improve uniformity of dark current.

Sixth Embodiment

Figure 12:
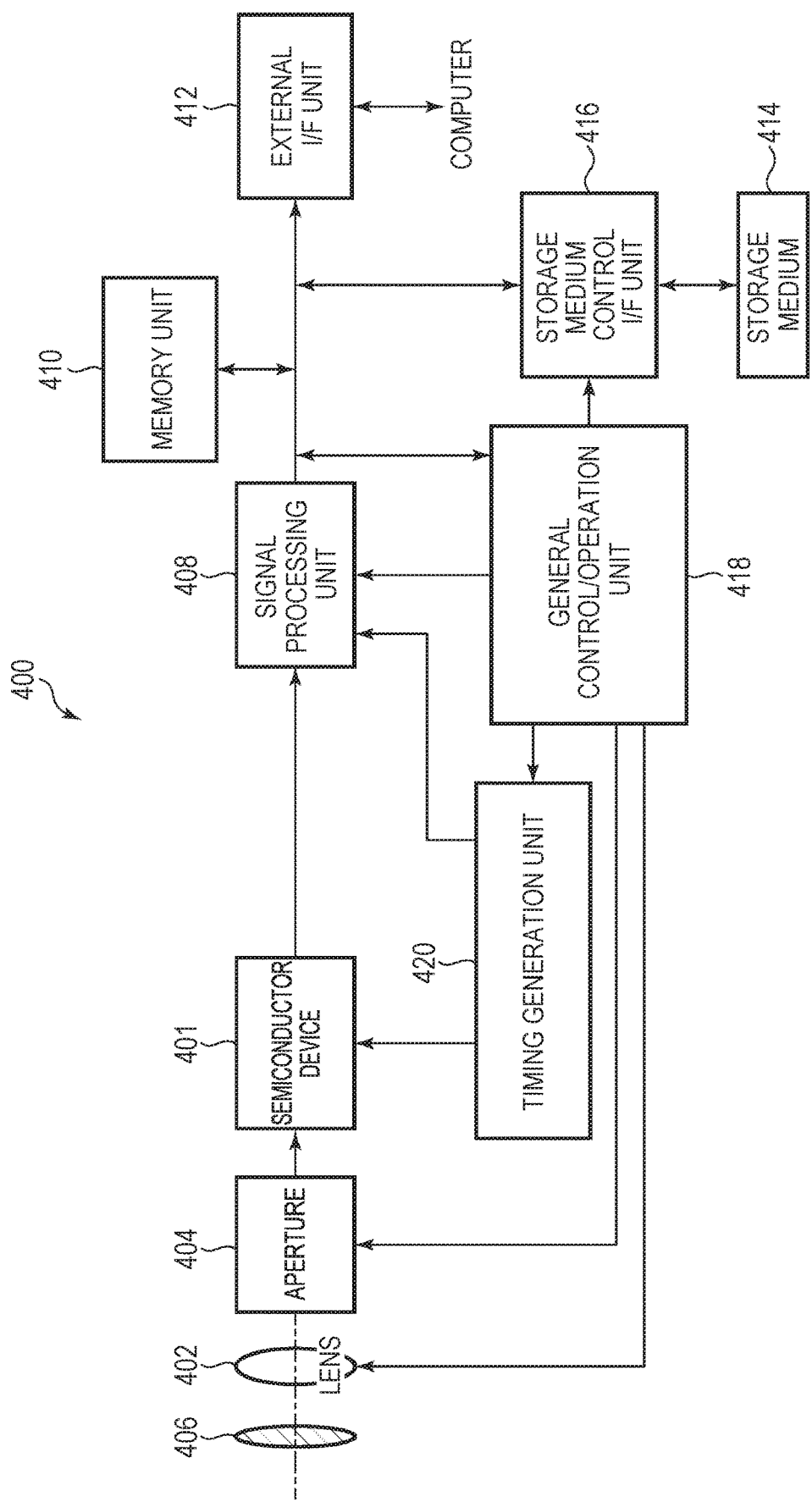
FIG. 12 is a block diagram illustrating a general configuration of an imaging system according to a sixth embodiment of the present invention.

An imaging system according to a sixth embodiment of the present invention will be described with reference to FIG. 12. FIG. 12 is a block diagram illustrating a general configuration of the imaging system according to the present embodiment.

The semiconductor devices as the photoelectric conversion devices described in the above first to fifth embodiments can be applied to various imaging systems. An example of applicable imaging systems may be a digital still camera, a digital camcorder, a surveillance camera, a copying machine or a fax machine, a mobile phone, an on-vehicle camera, an observation satellite, or the like. Further, a camera module including an optical system such as a lens and a semiconductor device as an imaging device is also included in the imaging system. FIG. 12 illustrates a block diagram of a digital still camera as an example thereof.

An imaging system 400 illustrated as an example in FIG. 12 includes a semiconductor device 401, a lens 402 that captures an optical image of an object onto the semiconductor device 401, an aperture 404 for changing a light amount passing through the lens 402, and a barrier 406 for protecting the lens 402. The lens 402 and the aperture 404 form an optical system that converges a light onto the semiconductor device 401. The semiconductor device 401 is the semiconductor device 1 described in any of the first to fifth embodiments and converts an optical image captured by the lens 402 into image data.

The imaging system 400 further includes a signal processing unit 408 that performs processing of an output signal output from the semiconductor device 401. The signal processing unit 408 performs generation of image data from the digital signal output from the semiconductor device 401. Further, the signal processing unit 408 performs an operation to perform various correction or compression if necessary and output image data. The semiconductor device 401 may have an AD conversion unit that generates a digital signal processed by the signal processing unit 408. The AD conversion unit may be formed in a semiconductor layer (semiconductor substrate) in which a photoelectric converter of the semiconductor device 401 is formed or may be formed in another semiconductor substrate from the semiconductor layer in which the photoelectric converter of the semiconductor device 401 is formed. Further, the signal processing unit 408 may be formed in the same semiconductor substrate as that for the semiconductor device 401.

The imaging system 400 further includes a memory unit 410 for temporarily storing image data therein and an external interface unit (external I/F unit) 412 for communicating with an external computer or the like. The imaging system 400 further includes a storage medium 414 such as a semiconductor memory for performing storage or readout of imaging data and a storage medium control interface unit (storage medium control I/F unit) 416 for performing storage or readout on the storage medium 414. Note that the storage medium 414 may be embedded in the imaging system 400 or may be removable.

Furthermore, the imaging system 400 includes a general control/operation unit 418 that controls various operations and the entire digital still camera and a timing generation unit 420 that outputs various timing signals to the semiconductor device 401 and the signal processing unit 408. Here, the timing signal or the like may be input from the outside, and the imaging system 400 may have at least the semiconductor device 401 and the signal processing unit 408 that processes an output signal output from the semiconductor device 401.

The semiconductor device 401 outputs an imaging signal to the signal processing unit 408. The signal processing unit 408 performs predetermined signal processing on an imaging signal output from the semiconductor device 401 and outputs image data. The signal processing unit 408 uses an imaging signal to generate an image.

As discussed above, according to the present embodiment, the imaging system to which the semiconductor device according to the first to fifth embodiments is applied can be implemented.

Seventh Embodiment

Figure 13A:
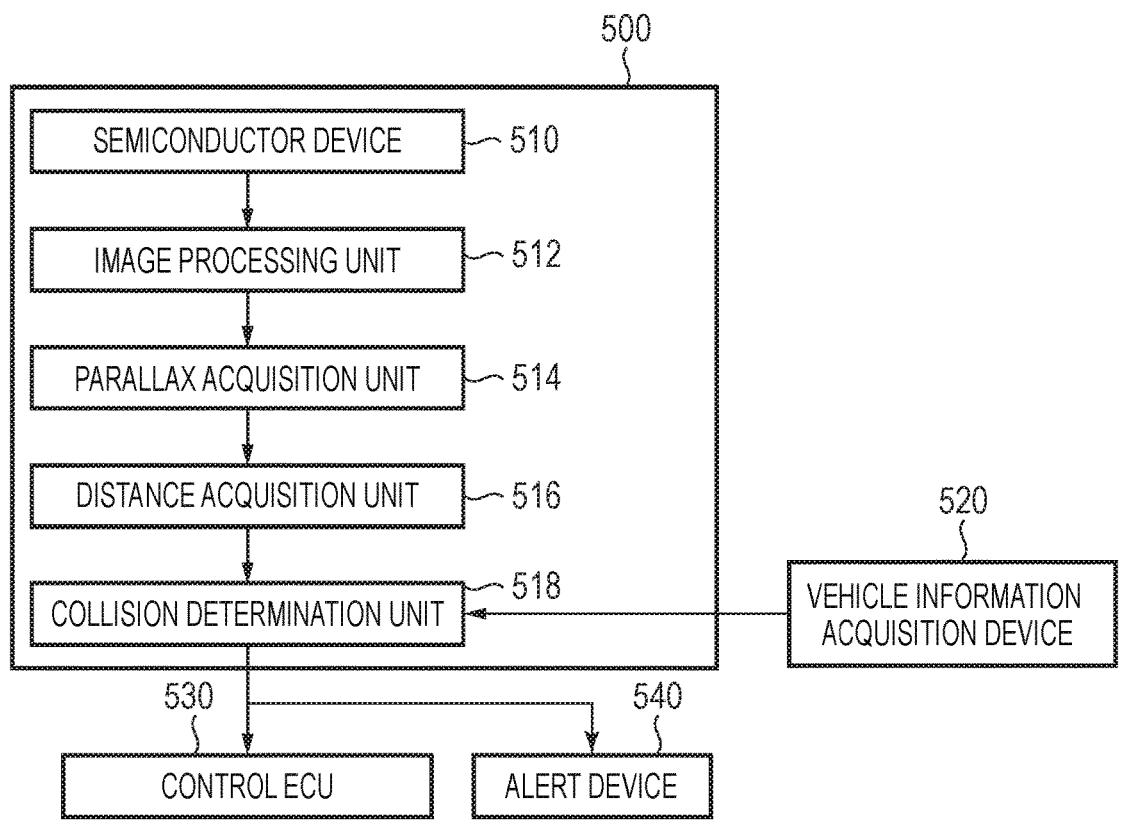
FIG. 13A is a diagram illustrating a configuration example of an imaging system according to a seventh embodiment of the present invention.
Figure 13B:
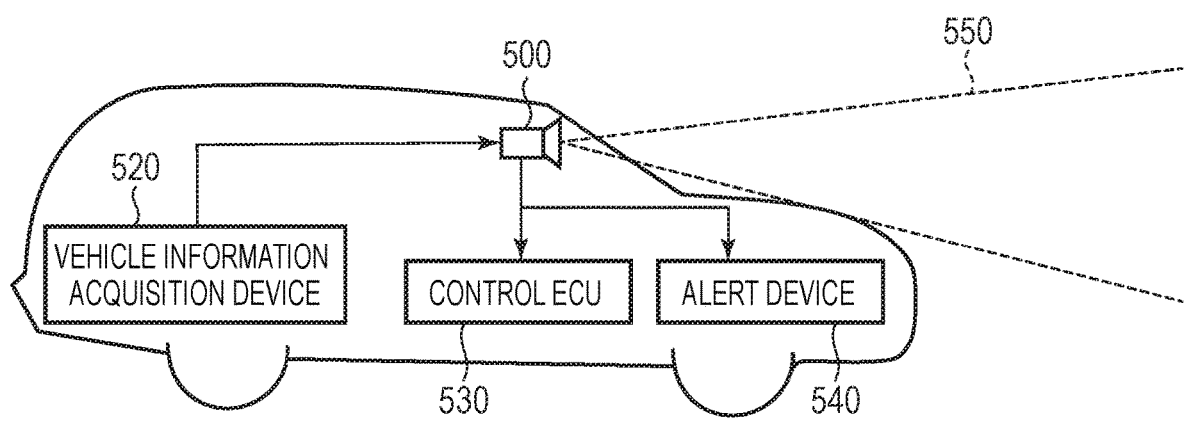
FIG. 13B is a diagram illustrating a configuration example of a movable object according to the seventh embodiment of the present invention.

An imaging system and a movable object according to a seventh embodiment of the present invention will be described with reference to FIG. 13A and FIG. 13B. FIG. 13A is a diagram illustrating a configuration of the imaging system and the movable object according to the present embodiment. FIG. 13B is a diagram illustrating a configuration of the imaging system and the movable object according to the present embodiment.

FIG. 13A illustrates an example of an imaging system related to an on-vehicle camera. An imaging system 500 includes a semiconductor device 510. The semiconductor device 510 is the semiconductor device 1 described in any of the first to fifth embodiments described above. The imaging system 500 includes an image processing unit 512 that performs image processing on a plurality of image data acquired by the semiconductor device 510 and a parallax acquisition unit 514 that calculates a parallax (a phase difference of parallax images) from the plurality of image data acquired by the imaging system 500. Further, the imaging system 500 includes a distance acquisition unit 516 that calculates a distance to the object based on the calculated parallax and a collision determination unit 518 that determines whether or not there is a collision possibility based on the calculated distance. Here, the parallax acquisition unit 514 and the distance acquisition unit 516 are an example of a distance information acquisition unit that acquires distance information on the distance to the object. That is, the distance information is information on a parallax, a defocus amount, a distance to an object, or the like. The collision determination unit 518 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like or may be implemented by combination thereof.

The imaging system 500 is connected to the vehicle information acquisition device 520 and can acquire vehicle information such as a vehicle speed, a yaw rate, a steering angle, or the like. Further, the imaging system 500 is connected to a control ECU 530, which is a control device that outputs a control signal for causing a vehicle to generate braking force based on a determination result by the collision determination unit 518. Further, the imaging system 500 is also connected to an alert device 540 that issues an alert to the driver based on a determination result by the collision determination unit 518. For example, when the collision probability is high as the determination result of the collision determination unit 518, the control ECU 530 performs vehicle control to avoid a collision or reduce damage by applying a brake, pushing back an accelerator, suppressing engine power, or the like. The alert device 540 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 500. FIG. 13B illustrates the imaging system when a front area of a vehicle (a capturing area 550) is captured. The vehicle information acquisition device 520 transmits an instruction to the imaging system 500 or the semiconductor device 510. Such a configuration can further improve the ranging accuracy.

Further, although the example of control for avoiding a collision to another vehicle has been described above in the present embodiment, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, the imaging systems illustrated in the above sixth and seventh embodiments are illustration of an imaging system example to which the semiconductor device of the present invention may be applied, and the imaging system to which the semiconductor device of the present invention is applicable is not limited to the configuration illustrated in FIG. 12 and FIG. 13A.

The semiconductor device of the present invention can be widely applied to equipment using object recognition without being limited to imaging systems or movable objects. The scope of the equipment as used herein includes electronic equipment (cameras, smartphones, and the like), office equipment (scanners and the like), transport equipment (vehicles, ships, airplanes, and the like), medical equipment (endoscopes, radiographic inspection equipment, and the like), analysis equipment (SEMs, TEMs, and the like), industry equipment (robots and the like), and the like. These equipment may be configured including the semiconductor device described in the above embodiments and a signal processing unit that processes a signal output from that semiconductor device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-137650, filed Jul. 26, 2019 which is hereby incorporated by reference herein in its entirety.

What is claimed is:

1. A semiconductor device comprising:
a semiconductor layer in which a plurality of pixels each including a photoelectric converter is provided; and
an interconnection structure arranged over the semiconductor layer,
wherein the plurality of pixels includes a first light-receiving pixel and a second light-receiving pixel,
wherein the interconnection structure includes:
a first insulating film made of a first insulating material;
a first insulating member arranged in association with the first light-receiving pixel and made of a second insulating material having a larger hydrogen content than the first insulating material; and
a second insulating member arranged in association with the second light-receiving pixel and made of the second insulating material, and
wherein a volume of the first insulating member is larger than a volume of the second insulating member.

2. The semiconductor device according to claim 1, wherein when vertically projected on a projection plane parallel to a primary face of the semiconductor layer, an area of the first insulating member on the projection plane is larger than an area of the second insulating member on the projection plane.

3. The semiconductor device according to claim 1, wherein when vertically projected on a projection plane parallel to a primary face of the semiconductor layer, the photoelectric converter of the first light-receiving pixel and the first insulating member are at least partially overlapped with each other on the projection plane, and the photoelectric converter of the second light-receiving pixel and the second insulating member are at least partially overlapped with each other on the projection plane.

4. The semiconductor device according to claim 1, wherein the first insulating member and the second insulating member are provided apart from the semiconductor layer by 10 nm or more.

5. The semiconductor device according to claim 1,
wherein the plurality of pixels includes a light-shielded pixel, and
wherein the interconnection structure includes no insulating member made of the second insulating material in the first insulating film of a portion corresponding to a light-shielded pixel region in which the light-shielded pixel is arranged.

6. The semiconductor device according to claim 1,
wherein the semiconductor layer further includes a peripheral circuit region in which a circuit that drives the plurality of pixels is arranged, and
wherein the interconnection structure includes no insulating member made of the second insulating material in the first insulating film of a portion corresponding to the peripheral circuit region.

7. The semiconductor device according to claim 1, wherein the second insulating material is silicon nitride.

8. The semiconductor device according to claim 1,
wherein the first light-receiving pixel and the second light-receiving pixel are arranged in an outer edge part of a light-receiving pixel region in which the plurality of pixels is arranged, and
wherein the first light-receiving pixel is located in a more outer part of the light-receiving pixel region than the second light-receiving pixel.

9. The semiconductor device according to claim 8, wherein the outer edge part is a region having a width of 300 µm or less from an outer circumference of the light-receiving pixel region.

10. The semiconductor device according to claim 1, wherein the first insulating material contains hydrogen.

11. The semiconductor device according to claim 1, wherein the first insulating material is silicon oxide or silicon oxycarbide.

12. The semiconductor device according to claim 1 further comprising an optical structure arranged on an opposite side of the semiconductor layer from the interconnection structure.

13. The semiconductor device according to claim 1 further comprising an optical structure arranged on an opposite side of the interconnection structure from the semiconductor layer.

14. An equipment comprising:
the semiconductor device according to claim 1; and
a signal processing unit that processes a signal output from the semiconductor device.

15. A semiconductor device comprising:
a semiconductor layer in which a plurality of pixels each including a photoelectric converter is provided; and
an interconnection structure arranged over the semiconductor layer,
wherein the plurality of pixels includes a first light-receiving pixel and a second light-receiving pixel,
wherein the interconnection structure includes a first insulating film made of a first insulating material and a second insulating film provided over the semiconductor layer side of the first insulating film and made of a third insulating material that permeates less hydrogen than the first insulating material,
wherein an insulating member made of the first insulating material is located between the first insulating film and the semiconductor layer,
wherein in a portion corresponding to the first light-receiving pixel, the first insulating film and the insulating member are connected to each other via a first opening provided in the second insulating film,
wherein in a portion corresponding to the second light-receiving pixel, the first insulating film and the insulating member are connected to each other via a second opening provided in the second insulating film, and
wherein the first opening is larger than the second opening.

16. The semiconductor device according to claim 15, wherein when vertically projected on a projection plane parallel to a primary face of the semiconductor layer, the photoelectric converter of the first light-receiving pixel and the first opening are at least partially overlapped with each other on the projection plane, and the photoelectric converter of the second light-receiving pixel and the second opening are at least partially overlapped with each other on the projection plane.

17. The semiconductor device according to claim 15, wherein the third insulating material is silicon carbide, silicon nitride, or silicon carbonitride.

18. A semiconductor device comprising:
a semiconductor layer in which a plurality of pixels each including a photoelectric converter is provided;
a substrate arranged so as to overlap the semiconductor layer; and
an interconnection structure arranged between the semiconductor layer and the substrate,
wherein the plurality of pixels includes a first light-receiving pixel and a second light-receiving pixel,
wherein the interconnection structure includes:
a first insulating film made of a first insulating material; and
an insulating member made of a second insulating material having a larger hydrogen content than the first insulating material, and
wherein a hydrogen content in a portion corresponding to the first light-receiving pixel is larger than a hydrogen content in a portion corresponding to the second light-receiving pixel.

19. The semiconductor device according to claim 18,
wherein the insulating member includes:
a first insulating member arranged in association with the first light-receiving pixel and made of the second insulating material; and
a second insulating member arranged in association with the second light-receiving pixel and made of the second insulating material, and
wherein a volume of the first insulating member is larger than a volume of the second insulating member.

20. The semiconductor device according to claim 18, wherein the substrate includes a signal processing circuit.

* * * * *